United States Patent
Zeller

(10) Patent No.: US 12,352,839 B2
(45) Date of Patent: Jul. 8, 2025

(54) METHOD AND DEVICE FOR DRIVING A MAGNETIC RESONANCE IMAGING SYSTEM

(71) Applicant: Siemens Healthineers AG, Forchheim (DE)

(72) Inventor: Mario Zeller, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 0 days.

(21) Appl. No.: 18/523,470

(22) Filed: Nov. 29, 2023

(65) Prior Publication Data

US 2024/0219500 A1    Jul. 4, 2024

(30) Foreign Application Priority Data

Dec. 30, 2022   (EP) ..................... 22217282

(51) Int. Cl.
*G01V 3/00* (2006.01)
*G01R 33/483* (2006.01)
(Continued)

(52) U.S. Cl.
CPC ...... *G01R 33/5611* (2013.01); *G01R 33/4835* (2013.01); *G01R 33/565* (2013.01)

(58) Field of Classification Search
CPC ............ G01R 33/4826; G01R 33/5618; G01R 33/56341
(Continued)

(56) References Cited

U.S. PATENT DOCUMENTS 6,043,651 A    3/2000   Heid
10,162,037 B2  12/2018  Zeller et al.
(Continued)

FOREIGN PATENT DOCUMENTS

CN    1683939 A    10/2005
CN    103961097 A   8/2014
(Continued)

OTHER PUBLICATIONS

Jun. 13, 2023 (EP) Extended European Search Report—App. 222172182.7 (with translation).
(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

A method for driving a MRI system to generate MRI data of an examination subject may include performing an accelerated echoplanar imaging with an undersampling according to a pulse sequence diagram to acquire k-space data. The pulse sequence diagram may have a plurality of repetitions respectively including: a first sampling diagram configured for an acquisition of k-space data for Nyquist ghost correction, or to generate magnetic field maps, a subsequent second sampling diagram configured for an accelerated echoplanar acquisition, and an excitation diagram that is common to both acquisitions. The first sampling diagram of a real subset of the plurality of repetitions may be modified to: supplement the acquired k-space data using a supplementation of k-space data missing due the undersampling, and/or correct image space of artifacts occurring due to the undersampling based on the k-space data acquired with the modified first sampling diagram.

14 Claims, 10 Drawing Sheets

(51) Int. Cl.
*G01R 33/561* (2006.01)
*G01R 33/565* (2006.01)

(58) Field of Classification Search
USPC .......................................................... 324/309
See application file for complete search history.

(56) References Cited

U.S. PATENT DOCUMENTS

| | | | |
|---|---|---|---|
| 10,557,903 | B2 | 2/2020 | Carinci et al. |
| 11,280,870 | B2 | 3/2022 | Zeller |
| 2005/0237057 | A1 | 10/2005 | Porter |
| 2012/0313640 | A1* | 12/2012 | Pfeuffer ............ G01R 33/56572 324/309 |
| 2018/0356488 | A1 | 12/2018 | Zeller |
| 2020/0088826 | A1 | 3/2020 | Zeller |
| 2021/0156940 | A1 | 5/2021 | Sommer et al. |

FOREIGN PATENT DOCUMENTS

| | | | | |
|---|---|---|---|---|
| CN | 107615089 A | * | 1/2018 | ............ G01R 33/561 |
| CN | 110244246 A | | 9/2019 | |
| CN | 110907872 A | | 3/2020 | |
| CN | 111989583 A | | 11/2020 | |
| DE | 102012212402 B3 | * | 10/2013 | ............. G01R 33/28 |
| DE | 102017209988 B3 | | 6/2018 | |
| WO | WO-03046597 A1 | * | 6/2003 | ......... G01R 33/3854 |
| WO | WO-2008048641 A2 | * | 4/2008 | ............. A61B 5/055 |
| WO | WO-2016188974 A1 | * | 12/2016 | ......... G01R 33/4824 |

OTHER PUBLICATIONS

Aug. 20, 2024 (EP) Communication under Rule 71(3)—Intention to Grant for EP App. 22217282.7 (with translation).
Chen, N.K., Wyrwicz, A.M. "Single-Shot and Segmented EPI Ghost Artifacts Removal With Two-Dimensional Phase Correction" (2000): 1713.
Chi, D et al.: "Field-Mapping-Embedded EPI for Geometric Distortion Correction", Proc. Intl. Soc. Mag. Reson. Med. 30 (2022); https://submissions.mirasmart.com/ISMRM2022/Itinerary/Files/PDFFiles/1099.html.
Yarach, Uten et al; "Iterative SENSE with Integrated EPI Nyquist Ghost and Distortion Corrections", Proceedings of the International Society For Magnetic Resonance in Medicine, 25th annual meeting & exhibition; published Apr. 7, 2017; XP040692725; USA.
Setsompop, Kawin et al.: "Blipped-Controlled Aliasing in Parallel Imaging for Simultaneous Multislice Echo Planar Imaging with Reduced g-Factor Penalty"; in: Magnetic Resonance in Medicine; vol. 67; pp. 1210-1224; 2012.
Hoge, W. Scott et al.; "A Dual-Polarity Grappa Kernel for the Robust Reconstruction of Accelerated EPI data"; 2015 IEEE 12th international symposium on biomedical imaging (ISBI); published Apr. 16, 2015, pp. 1244-1247; XP033179632; DOI: 10.1109/ISBI.2015.7164099.
Hammernik, K., et al. "Σ-net: Systematic evaluation of iterative deep neural networks for fast parallel MR image reconstruction." arXiv preprint arXiv:1912.09278 1 (2019).
Hoge W. Scott, et al. "Dual-Polarity GRAPPA for Simultaneous Reconstruction and Ghost Correction of Echo Planar Imaging Data" Magnetic Resonance in Medicine, 2016, 76:32-44, 32 pages; 2016.

* cited by examiner

METHOD AND DEVICE FOR DRIVING A MAGNETIC RESONANCE IMAGING SYSTEM

CROSS REFERENCE TO RELATED APPLICATIONS

This patent application claims priority to European Patent Application No. 22217282.7, filed Dec. 30, 2022, which is incorporated herein by reference in its entirety.

BACKGROUND

Field

The disclosure relates to a method for driving a magnetic resonance imaging system to generate magnetic resonance image data of an examination subject, in which method k-space data are acquired within the scope of an accelerated echoplanar imaging with an undersampling according to a pulse sequence diagram. The disclosure also relates to a control device for a magnetic resonance imaging system. Furthermore, the disclosure relates to a magnetic resonance imaging system.

Related Art

Imaging systems that are based on a method of magnetic resonance measurement, in particular on nuclear spins—what are known as magnetic resonance tomographs—have become successfully established and proven via numerous applications. In this type of image acquisition, most often a static basic magnetic field $B_0$ that serves for initial alignment and homogenization of magnetic dipoles to be examined is superimposed with a rapidly switched magnetic field—what is known as the gradient field—for spatial resolution of the imaging signal. To determine material properties of an examination subject to be imaged, the dephasing or relaxation time after a deflection of the magnetization out of the initial alignment is determined so that various material-typical relaxation mechanisms or relaxation times can be identified. The deflection most often takes place via a number of RF pulses (the abbreviation "RF" stands for "radio frequency"), also referred to as excitation pulses, and the spatial resolution is thereby based on a temporally fixed manipulation of the deflected magnetization with the aid of the gradient field in what is known as a measurement sequence or activation sequence, which establishes a precise chronological order of RF pulses, the change of the gradient field (via emission of a switching sequence of gradient pulses), and the recording of measurement values.

An association between measured magnetization—from which the mentioned material properties can be derived—and a spatial coordinate of the measured magnetization in positional space in which the examination subject is arranged typically takes place with the aid of an intermediate step. In this intermediate step, detected raw magnetic resonance data, also referred to as k-space data, are arranged at readout points in what is known as "k-space," wherein the coordinates of k-space are encoded as a function of the gradient field. The magnitude of the magnetization (in particular of the transverse magnetization in a plane transverse to the previously described basic magnetic field) at a specific location of the examination subject can be determined from the data of the readout point with the aid of a Fourier transformation, which calculates a signal strength of the signal in positional space from a signal strength (magnitude of the magnetization) that is associated with a defined frequency (the spatial frequency) or phase position.

Magnetic resonance tomography is a relatively slow-working type of imaging method, since the data are sequentially acquired along lines in Fourier space or k-space, and there must not be less than a certain time for the spin relaxation of the excited spins. The method for acquiring images in two-dimensional slices is markedly less error-prone in comparison to acquisition in three dimensions, because the number of encoding steps is less than in a three-dimensional method. Therefore, in many applications, image volumes with stacks of two-dimensional slices are used instead of a single three-dimensional acquisition. However, the image acquisition times are very long due to the long relaxation times of the spins, which means, for example, a reduction in the comfort of patients to be examined. Also, during the acquisition the patients cannot briefly leave the magnetic resonance tomograph, or even just adjust their position, since this would negate the image acquisition process due to the position change, and the entire process would need to start over from the beginning. It is consequently an important goal to accelerate the acquisition of two-dimensional slice stacks.

For example, parallel image acquisition techniques are applied to accelerate the image acquisition. In some of the image acquisition techniques, artifacts may occur due to undersampling. These artifacts can be eliminated via application of reconstruction algorithms.

Echoplanar imaging (abbreviated as EPI or EPI pulse sequence) is often used for accelerated acquisition of raw magnetic resonance data. A plurality of echoes, also referred to as an echo train, is thereby acquired per repetition by switching frequency gradients, also referred to as readout gradients, back and forth. An image can thus be acquired with a low number of excitations or repetitions.

Echoplanar imaging sequences are often applied in the form of multi-slice imaging sequences in order to accelerate the imaging and, for example, also in order to enable acquisitions of moving subjects. In spite of the described echo train, echoplanar imaging sequences typically comprise a plurality of repetitions. What is understood by a repetition is a pulse sequence segment between two RF excitation pulses. Acquisitions with at least 60 repetitions are not a rarity, especially given what is known as BOLD imaging (BOLD=blood oxygenation level dependent; this type of imaging illustrates the oxygen content in the red corpuscles, with which—for example—the brain activity of a patient can be depicted) and expanded diffusion protocols such as MDDW (MDDW=multi-directional diffusion weighting=diffusion-weighted imaging in multiple directions).

Typically, in the individual repetitions, three respective lines for the correction of Nyquist ghosting and/or for correction of a $B_0$ drift are acquired directly after the excitation pulse, within the scope of what is known as a navigator acquisition. In this way, a very high temporal resolution results for the correction of the cited artifacts results given the noted high number of repetitions.

As was already mentioned, EPI acquisitions with parallel imaging techniques, for example GRAPPA (GRAPPA=GeneRalized Autocalibrating Partially Parallel Acquisitions) or SMS (SMS=Simultaneous Multi-Slice), are performed in order to simultaneously graphically acquire a plurality of slices.

In addition to this, there are expanded correction methods such as, for example, "Dual Polarity" (see Hoge et al., "Dual-Polarity GRAPPA for Simultaneous Reconstruction and Ghost Correction of Echo Planar Imaging Data," Magnetic Resonance in Medicine 2016 July; 76(1):32-44. DOI: 10.1002/mrm.25839. Epub 2015 Jul. 24) regarding especially precise correction of ghost artifacts, or spatially resolved eddy current correction methods (see Chen et al., "Single-Shot and Segmented EPI Ghost Artifacts Removal with Two-Dimensional Phase Correction," Proc. Intl. Soc. Magn. Reson. Med. 8 (2000)). In these cited specific methods, navigator data are required for the mentioned correction methods and additional reference data are required for an expansion of undersampled k-space data. The number of required repetitions of the pulse sequence therewith increases, and thus also the measuring time or the time for such an EPI image acquisition method.

In Chi et al., "Field-Mapping-Embedded EPI for Geometric Distortion Correction," Proc. Intl. Soc. Mag. Reson. Med. 30 (2022) 1099, a method is described in which the existing three lines of the navigator acquisition are modified to detect Nyquist ghosting correction data and are continued over the duration of the entire acquisition so that, in each repetition, a different k-space segment to be acquired is encoded. The acquired k-space segments are merged into matching k-spaces, and $B_0$ field maps for the correction of geometric distortions can be acquired therefrom over the duration of the acquisition. The polarity of the readout gradients for the acquisition of the correction data is mirrored in the kx direction (readout direction) so that k-space data in three unipolar k-spaces are obtained for the later image-based calculation of $B_0$ field maps. Additional reference scans for the application of parallel imaging methods are required for generation of the $B_0$ field maps. The method is depicted in FIG. 1 and FIG. 2.

In U.S. Pat. No. 10,162,037 $B_2$ and U.S. Pat. No. 11,280,870 $B_2$, methods are described in which an acquisition diagram of the three lines of the navigator acquisition is modified such that slice-specific ghost correction data are obtained for an SMS imaging.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 12:
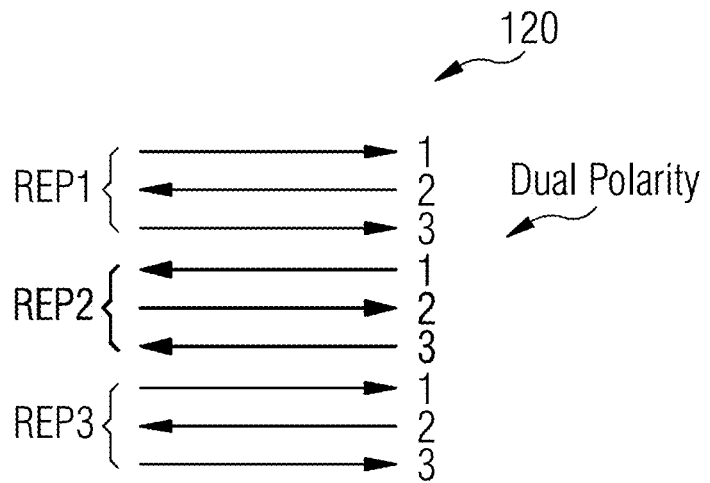

FIG. 12 illustrates a diagram for obtaining reference lines of a first kernel for a Dual Polarity GRAPPA calibration in a method for driving a magnetic resonance imaging system to generate magnetic resonance image data of an examination subject, in which k-space data are acquired with an undersampling within the scope of an accelerated echoplanar imaging, according to an exemplary embodiment of the disclosure.

Figure 13:
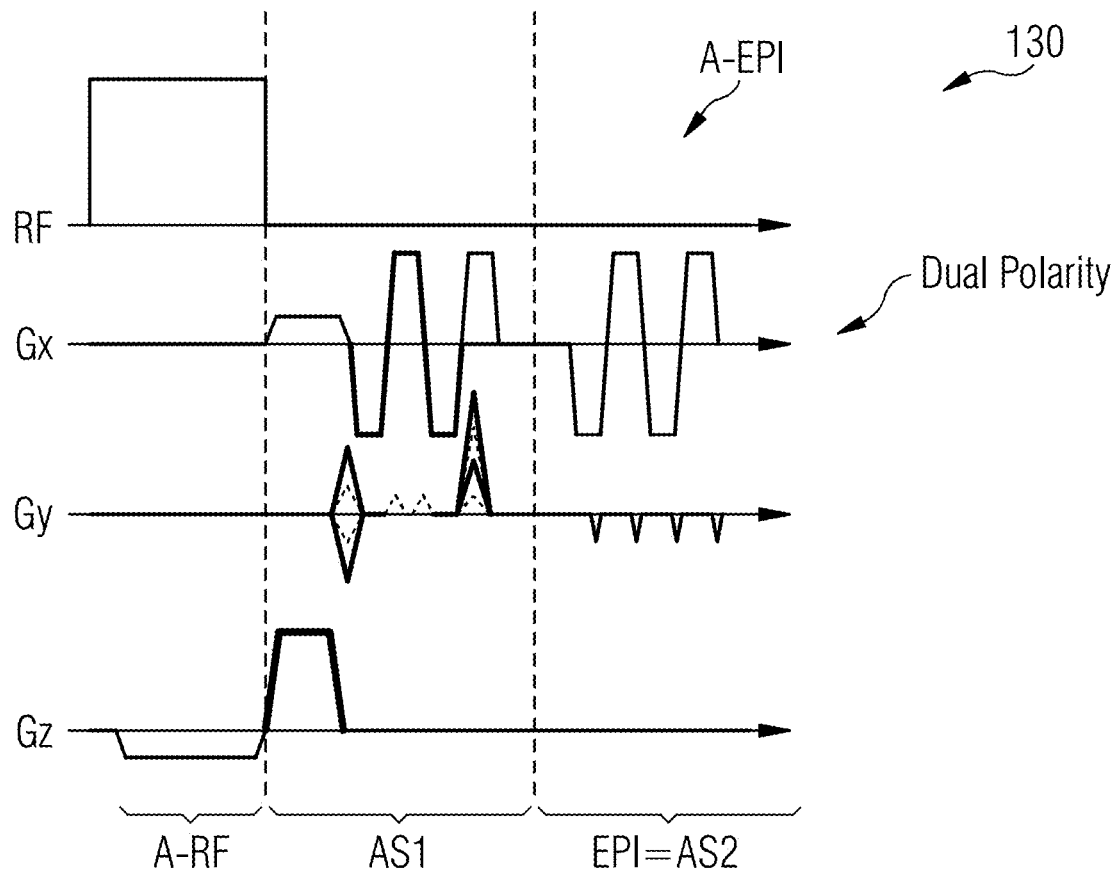

FIG. 13 illustrates a pulse sequence series for implementing the sampling diagram illustrated in FIG. 12, according to an exemplary embodiment of the disclosure.

Figure 14:
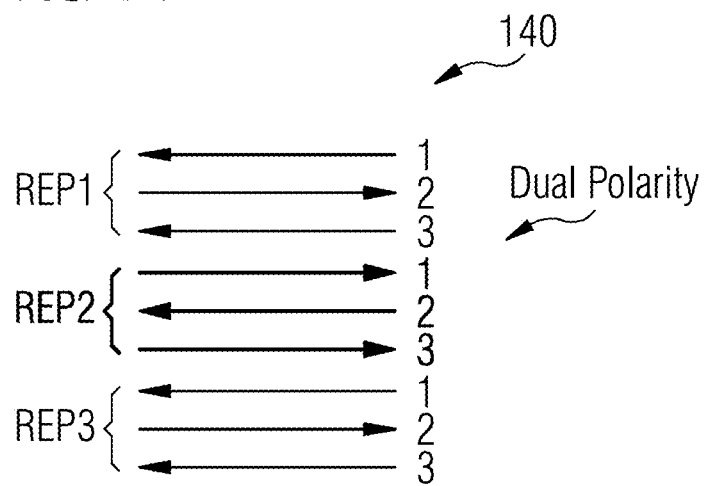

FIG. 14 illustrates a diagram for obtaining reference lines of a second kernel for a Dual Polarity GRAPPA calibration in a method for driving a magnetic resonance imaging system to generate magnetic resonance image data of an examination subject, in which k-space data are acquired with an undersampling within the scope of an accelerated echoplanar imaging, according to an exemplary embodiment of the disclosure.

Figure 15:
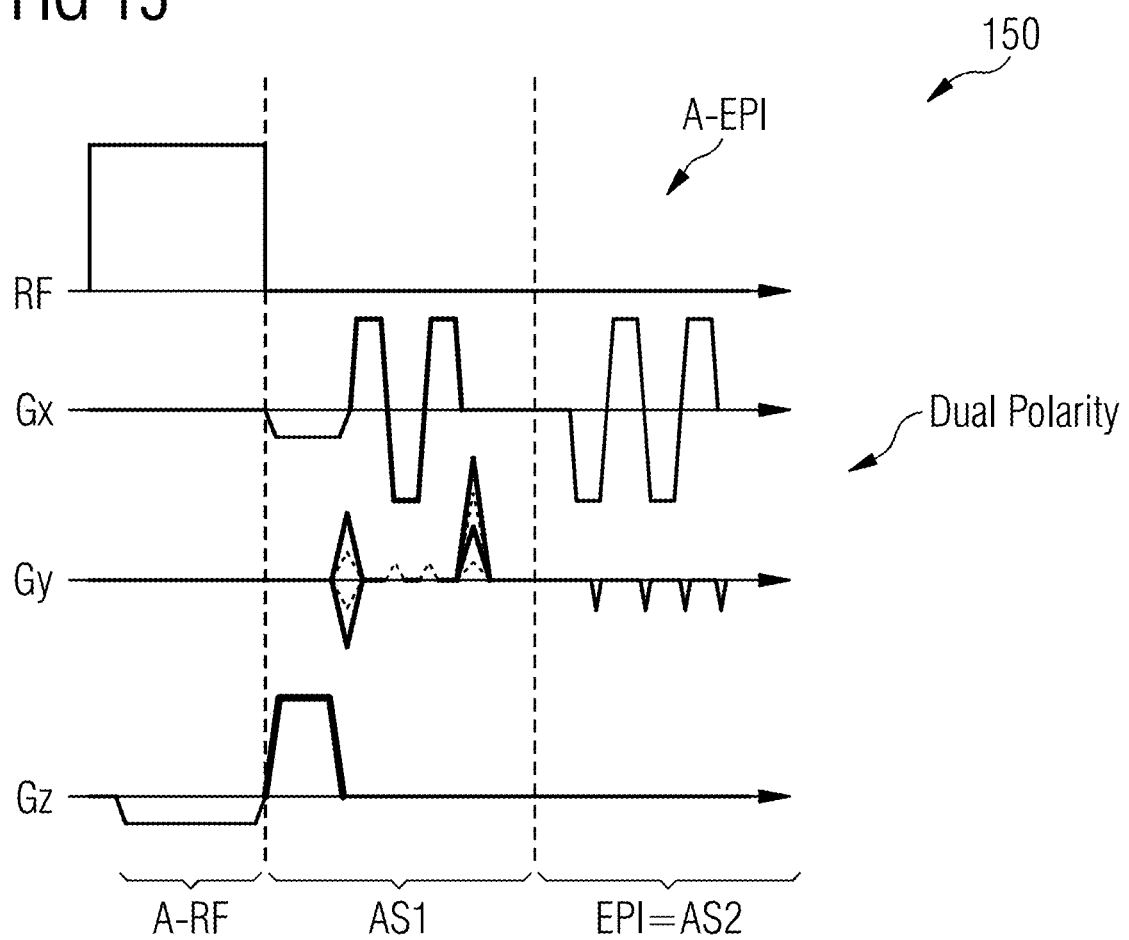

FIG. 15 illustrates a pulse sequence series for implementing the sampling diagram illustrated in FIG. 14, according to an exemplary embodiment of the disclosure.

Figure 16:
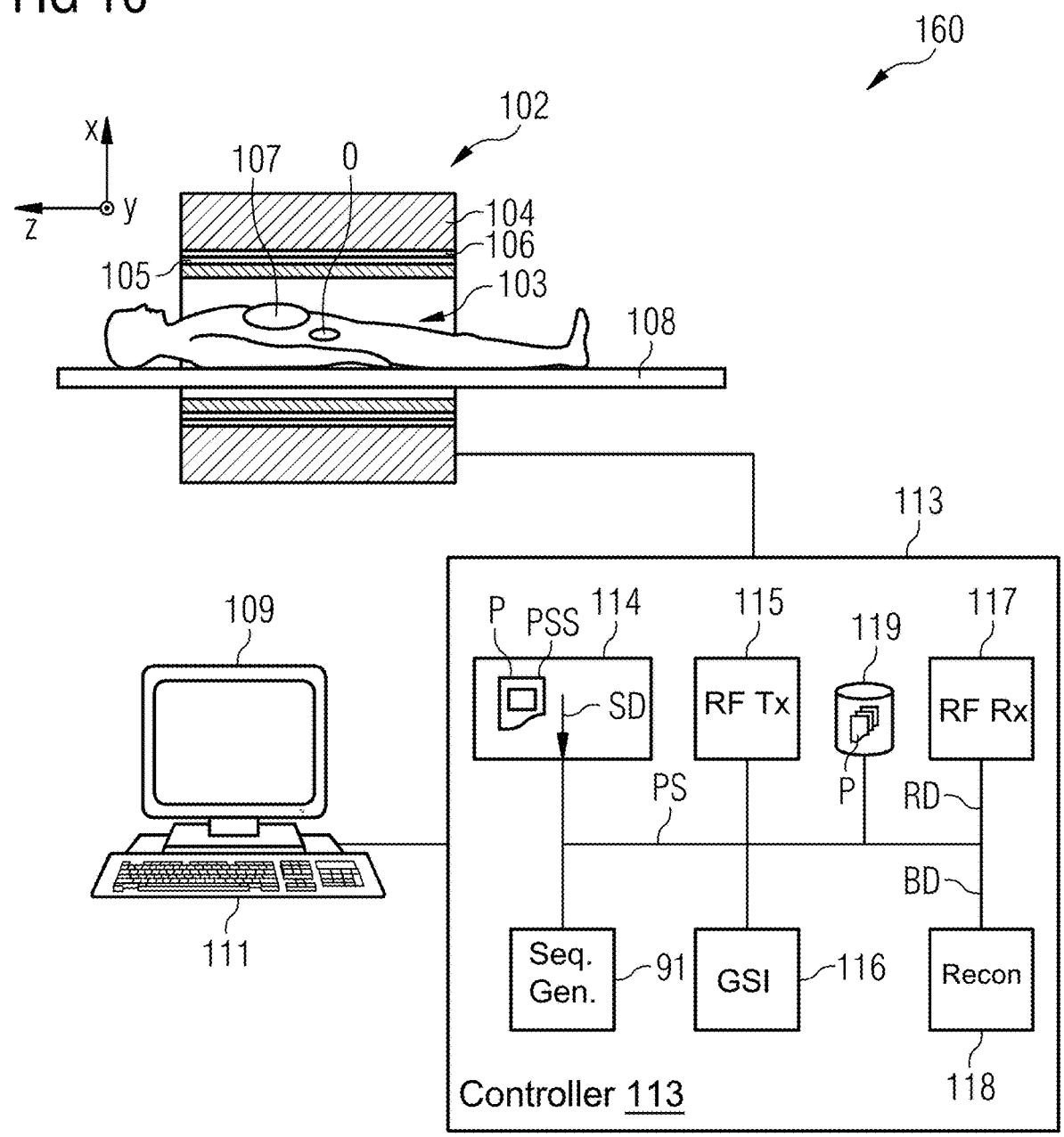

FIG. 16 illustrates a magnetic resonance imaging system according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure to specify a time-saving, accelerated echoplanar imaging method with a correction of what are known as Nyquist ghost effects, and with acquisition time that is reduced by comparison to conventional methods.

This object is achieved via a method for driving a magnetic resonance imaging system for generation of magnetic resonance image data of an examination subject, in which k-space data are acquired within the scope of an accelerated echoplanar imaging with an undersampling according to a pulse sequence diagram, according to the disclosure; via a control device for a magnetic resonance imaging system according to the disclosure; and via a magnetic resonance imaging system according to the disclosure.

The method according to the disclosure may comprise the sampling of k-space according to a pulse sequence diagram. This pulse sequence diagram has a plurality of repetitions which respectively comprise a first sampling diagram for an acquisition of k-space data for Nyquist ghosting correction and/or to generate magnetic field maps for magnetic field correction, such as for $B_0$ magnetic field correction or to generate what are known as $B_0$ field maps; a subsequent second sampling diagram for an accelerated echoplanar acquisition; and a common excitation diagram for both acquisitions. Magnetic field maps indicate the deviation of the field strength of magnetic fields generated in the magnetic resonance imaging from rated values. These deviations lead to phase deviations of the measurement signals, which must be considered in the image reconstruction. What is to be understood as a sampling diagram is the specific manner with which k-space is sampled with the aid of gradient switchings, wherein radio frequency signals are received as echo signals or measurement signals. In particular, such a sampling diagram corresponds to a specific k-space trajectory and a specific order of gradient pulses or, respectively, a specific gradient pulse sequence or partial gradient pulse sequence. The unmodified first sampling diagram is unencoded, meaning that the sampling takes place without phase encoding and thus the "zeroth" k-space line is sampled or received multiple times, such as three times in changing directions. What is to be understood as an accelerated echoplanar acquisition is an echoplanar acquisition in which, via an undersampling, time is saved in the acquisition of k-space data.

The first sampling diagram is modified, in a real subset of the plurality of repetitions, to the effect that a supplementation of signal information that is missing as a consequence of the undersampling is enabled on the basis of the k-space data acquired with the modified first sampling diagram. In particular, a supplementation of k-space data that are missing as a consequence of the undersampling, and/or a correction in image space of artifacts occurring due to the undersampling, should be enabled via the k-space data acquired with the modified first sampling diagram.

What is to be understood as a real subset is a subset of the plurality of repetitions that does not have at least one of the repetitions. In that the modification does not take place in all repetitions, there is also a number of repetitions—more precisely speaking, at least one repetition of the plurality of repetitions—in which the modification does not occur, and that therefore is used for acquisition of the k-space data for Nyquist ghosting correction. The modified sampling diagram is designed such that additional k-space data are therewith acquired that form a basis for a supplementation of the signal information that is missing due to the accelerated imaging. As was already mentioned, this missing signal information can comprise in particular missing k-space data in undersampled k-space regions. The missing signal information can, however, also comprise the artifacts in image space that are caused due to the missing k-space data. Therefore, for the acquisition of a portion of k-space, the modified first sampling diagram may be encoded, in contrast to the unmodified first sampling diagram, meaning that phase encoding gradients are switched in order to acquire phase encoding lines with different phase.

As will be explained later in more detail, information about the measurement behavior of the magnetic resonance system is obtained for the calculation of the missing k-space data on the basis of the additional k-space data, with which the missing k-space data can be reconstructed. In particular, given what are known as multi-coil systems with which accelerated imaging methods are typically implemented, information is obtained—via what is known as an auto-calibration—about with which weighting or which weights signals must be added by different coils from a point in k-space in order to calculate signals of adjacent points in k-space that were possibly not sampled.

Conclusions about the signal intensity in the non-sampled partial regions of k-space can thus be drawn on the basis of these weights and the undersampled k-space data. For this purpose, what are known as kernels, which comprise the mentioned weightings, may be calculated on the basis of the information determined in the auto-calibration. If these kernels are applied to the undersampled k-space data, the signal information that is absent due to the undersampling can thus be determined.

Alternatively, the supplementation of the missing signal information can also take place in image space, wherein coil sensitivity values are determined that enable a calculation of artifact-free image data on the basis of artifact-affected image data obtained with different coils via undersampling.

Given the reconstruction of the missing signal information in image space, for example as takes place in the SENSitivity Encoding (SENSE) method, the k-space data obtained with the modified first sampling diagram are used to determine coil sensitivity values. Moreover, respective artifact-affected image data are initially reconstructed with a limited field of view (FOV) for different coils, on the basis of the undersampled k-space data. A typical aliasing of projecting image portions occurs in these image data. Finally, artifact-free image data of the complete field of view (FOV) can be calculated on the basis of the coil sensitivity values and the artifact-affected image data with limited field of view.

While navigator data or k-space data for the Nyquist ghosting correction or $B_0$ magnetic field correction can be acquired unencoded or without phase encoding, an encoding (e.g., phase encoding) takes place in the acquisition of k-space data according to the modified first sampling diagram. This phase encoding allows the mentioned autocalibration, which may comprise a sampling of a partial region of k-space with increased resolution in comparison to the undersampling, such as with a complete sampling. Missing k-space data or missing signal information can be determined on the basis of these high-resolution sampled k-space data, wherein the reconstruction of the absent signal information can take place both in k-space, for example as in the GRAPPA method, and via a calculation in image space, for example as in the SENSE method. Image space data and k-space data can be transformed into one another via a Fourier transformation.

Given the common excitation process, a first slice selection gradient pulse may be generated in the slice selection direction. In addition to this, an RF excitation pulse is generated which—to generate one or more (e.g., N) slices to be excited simultaneously—comprises a corresponding N excitation frequencies, wherein N is a whole natural number. As is explained later in more detail, N has a value of at least 2 or at most 8.

As was already mentioned, the readout process to acquire the k-space data normally comprises the alternating switching of rephasing gradient pulses in the readout direction, wherein additional further gradient pulses are generated, for example in the phase direction and/or in the slice selection direction, and RF signals are received to acquire raw magnetic resonance data or, respectively, k-space data.

The method according to the disclosure utilizes the realization that the temporal resolution for the acquisition of what are known as navigator data for the Nyquist ghosting correction or the $B_0$ field correction does not need to be all that high, since the temporal development of interfering influences normally occurs slowly. Therefore, some of the pulse sequence segments that are conventionally used for the determination of correction data for the Nyquist ghosting or the $B_0$ field correction can be quasi-repurposed for the acquisition of k-space data as reference data. These reference data are used for the correction of artifacts occurring due to the undersampling.

If a compensation of the undersampling takes place in k-space, for example as in the GRAPPA method, the reference data are thus used for the calculation of missing k-space data for the actual imaging. Since the acceleration of an echoplanar acquisition is based on an undersampling of k-space, the k-space data that are missing—due to the undersampling—for a complete image information must be estimated or approximately calculated on the basis of reference data.

Advantageously, in contrast to a conventional procedure, a separate acquisition process to obtain the reference data now does not need to take place, wherein the total time for an imaging is reduced. Moreover, the duration of a repetition or an echo train does not need to be increased, since the acquisition of the reference data simply replaces the acquisition of the navigator data, and thus the echo time and the repetition time of the individual repetitions can remain the same or remain unchanged, independently of whether navigator data, or data for a correction of the Nyquist ghost effect, or reference data are acquired with the first sampling diagram.

The image acquisition duration, or the total time for acquisition of k-space data, is thus advantageously reduced in comparison to a conventional EPI pulse sequence, in which a separate acquisition of reference data takes place.

In addition to this, the disclosure relates to an activation sequence to drive a magnetic resonance imaging system. The activation sequence comprises activation signals corresponding to a pulse sequence diagram having a plurality of pulse sequence segments or repetitions respectively having an excitation segment and a readout segment.

The repetitions may comprise the mentioned common excitation diagram as a first pulse sequence sub-segment; the likewise aforementioned first sampling diagram for an acquisition of k-space data for Nyquist ghosting correction or for generation of magnetic field maps for magnetic field correction, in particular for $B_0$ field correction, as a second pulse sequence sub-segment; and the aforementioned second sampling diagram for an accelerated echoplanar acquisition as a third pulse sequence sub-segment. The first sampling diagram of a real subset of the plurality of repetitions is modified to the effect that a supplementation of k-space data that are missing as a result of the undersampling, and/or a correction in image space of artifacts occurring due to the undersampling, is enabled on the basis of the k-space data acquired with the modified sampling diagram. The activation sequence according to the disclosure grants the advantages of the method according to the disclosure for driving a magnetic resonance imaging system to generate magnetic resonance image data of an examination subject, in which method k-space data are acquired with an undersampling within the scope of an accelerated echoplanar imaging.

The control device (controller) according to the disclosure for a magnetic resonance system is configured to control the magnetic resonance imaging system. The control device may use the method according to the disclosure for driving a magnetic resonance imaging system to generate magnetic resonance image data of an examination subject, in which k-space data are acquired with an undersampling within the scope of an accelerated echoplanar imaging. The control device according to the disclosure shares the advantages of the method according to the disclosure for driving a magnetic resonance imaging system to generate magnetic resonance image data of an examination subject, in which k-space data are acquired with an undersampling according to a pulse sequence diagram within the scope of an accelerated echoplanar imaging.

The magnetic resonance imaging system according to the disclosure may comprise the control device according to the disclosure. The magnetic resonance imaging system according to the disclosure shares the advantages of the method according to the disclosure for driving a magnetic resonance imaging system to generate magnetic resonance image data of an examination subject, in which k-space data are acquired with an undersampling according to a pulse sequence diagram within the scope of an accelerated echoplanar imaging.

One or more of the aforementioned components of the method according to the disclosure for driving a magnetic resonance imaging system can be realized entirely or partially in the form of software modules in a processor of a corresponding computing system, for example by a control device of a magnetic resonance tomography system or by a computer that is used to control such a system. A realization largely in software has the advantage that even computing systems that are already in use can be upgraded in a simple manner via a software update in order to operate in the manner according to the disclosure. The control device may include processor circuitry that is configured to perform one or more functions of the control device. The object is inasmuch also achieved via a computer program product according to the disclosure, having a computer program which can be loaded directly into a computing system, with program segments in order to execute the steps of the method according to the disclosure to drive a magnetic resonance imaging system when the program is executed in the computing system. In addition to the computer program, such a computer program product can possibly comprise additional components such as, for example, documentation and/or additional components, also hardware components such as, for example hardware keys (dongles etc.) in order to use the software.

A computer-readable medium, for example a memory stick, a hard drive, or another transportable or permanently installed data medium, on which are stored the program segments of the computer program that can be read and executed by the computing system, can serve for the transport to the computing system or to the control device, and/or for storage at or in the computing system or the control device. For example, for this purpose the computing system can comprise one or more interacting microprocessors or the like.

The following specification contain respective particularly advantageous embodiments and developments of the disclosure. In particular, the features of one embodiment may thereby also be developed analogously to one or more other embodiments. In addition to this, within the scope of the disclosure, the various features of different exemplary embodiments may also be combined into new exemplary embodiments.

In an exemplary embodiment of the method according to the disclosure for driving a magnetic resonance imaging system, in the modification of the first sampling diagram the duration of the repetition affected by the modification, and also the duration of the second pulse sequence sub-segment which expresses the first sampling diagram, remains unchanged. A preservation of a stationary state of the spins that are deflected with regard to their magnetization, also referred to as a "steady state," is advantageously maintained. Such a "steady state" is required in particular given pulse sequences in which the repetition time or the echo time is shorter than the relaxation time of the excited spins. Image artifacts which would be caused by a disturbance of the steady state are advantageously avoided.

If, in a variant of the method according to the disclosure to drive a magnetic resonance imaging system, a change in the duration of the affected repetitions is affected via the modification of the first sampling diagram, it may be required or advantageous to compensate for this change in the duration via what are known as dummy pulses or preparation pulses, in order to enable a correct acquisition of k-space data or RF resonance signals.

For example, given such a modification of the first sampling diagram with modified duration, the number of k-space lines sampled per repetition given the modified first sampling diagram increases in comparison to the unmodified first sampling diagram, in order to be able to in this way sample an increased k-space region to obtain the reference data.

All pulse sequence segments, or repetitions of the plurality of repetitions of the EPI pulse sequence that is used for imaging, may comprise either the first sampling diagram or the modified first sampling diagram. A maximum quantity of k-space data is advantageously acquired for the correction of the artifacts and the supplementation of the undersampled k-space data.

In an exemplary embodiment, only precisely a single one of these repetitions, such as the first repetition, has the first sampling diagram, and the remaining or all remaining repetitions have the modified first sampling diagram, in order to maximize the set of k-space data which are used for the supplementation of the undersampled k-space data. In this variant, the resulting image quality is further improved due to the broader data basis for the determination of the k-space data that are missing due to the undersampling. In this embodiment, only the first repetition is used for an acquisition of unencoded k-space data, such as navigator data or corresponding k-space data for a correction of Nyquist ghost corrections and/or $B_0$ field corrections.

However, it can also be very advantageous to use a plurality of repetitions, distributed over the entire pulse sequence diagram, for an acquisition of unencoded k-space data, such as navigator data, for a correction of Nyquist ghost corrections and/or $B_0$ field corrections, in order to update correction factors for such a correction. The correction factors can advantageously be adapted to dynamic variations which influence the occurrence of artifacts such as, for example, Nyquist ghosting structures.

In an exemplary embodiment, the first sampling diagram in an EPI pulse sequence is replaced by differently modified sampling diagrams in different repetitions.

Differently modified first sampling diagrams for the sampling of k-space are hereby used in different repetitions. For example, individual gradients must vary for the sampling of different k-space regions. Moreover, it can also be necessary—as will be explained later in more detail—that a plurality of differently structured kernels acquired with different sampling diagrams is required for the calculation of the missing k-space data, for example if different acquisition techniques are to be combined or defined artifacts are to be especially exactly corrected.

In an exemplary variant of the method according to the disclosure for driving a magnetic resonance imaging system, the modified first sampling diagram and the number of the repetitions comprised by the real subset are selected so that a complete sampling takes place of a partial k-space region that is required at least for a complete supplementation of the missing k-space data. For the determination of the k-space data that are initially still missing given the undersampling, what are known as kernels may be calculated on the basis of k-space data that originate from a k-space region that has been completely sampled. In this event, that is the region of k-space that is sampled with the modified first sampling diagram.

Typical values for a generation of a kernel for a supplementation of k-space data in an undersampled image acquisition method are 24 phase space encoding lines, for which 8 repetitions are required if a GRAPPA sampling diagram is chosen or 16 repetitions if an SMS sampling diagram is chosen, if the first sampling diagram is designed for the sampling of 3 phase space encoding lines and nothing about this number is changed in the modification. In choosing a sampling of M phase space encoding lines for the correction of the Nyquist ghost effects (M is a natural number), accordingly 24/M modified repetitions are required for the GRAPPA sampling diagram, and 48/M modified repetitions for the SMS sampling diagram.

In the method according to the disclosure, the modified first sampling diagram consequently may comprise a sampling of at least three k-space lines in the readout direction with different phase encoding. Advantageously, in the N/2 Nyquist ghost correction, three k-space lines are sufficient for a correction in three spatial directions. In this advantageous variant, the number of the three gradient pulses in the readout direction does not need to be changed given the modification of the first sampling diagram. At this point, it should be noted that the first sampling diagram can also comprise only the sampling of one or two k-space lines, or more than three k-space lines, in the readout direction. In an exemplary embodiment, a sampling of k-space lines according to the first, unmodified sampling diagram should in particular explicitly include the variant in which the sampling of the same k-space line possibly takes place multiple times in both directions. In an exemplary embodiment, the sampling may take place unencoded. Should the number of sampled k-space lines of the modified first sampling diagram differ from the number of the sampled k-space lines of the unmodified first sampling diagram, further additional, aforementioned modifications are possibly reasonable as a compensation in order to not change, or not too significantly change, the echo time and the repetition time of the modified repetitions in comparison to the unmodified repetitions.

The modified first sampling diagram of the method according to the disclosure may comprise a sampling of at least three k-space lines in the readout direction, with at least partially different slice encoding. For the reasons cited in the preceding, this different slice encoding is very effective in order to improve the image quality, in particular in image acquisition methods with simultaneous slice imaging technique, especially for SMS, GRAPPA+SMS, and Dual Polarity GRAPPA.

In an exemplary embodiment, an analogously structured sampling diagram may be used for the modified first sampling diagram and the second sampling diagram (i.e., a sampling diagram of the same type may be used). If a sampling diagram of the same type is used for the generation of the reference data, thus the k-space data, on the basis of which undersampled k-space data should be supplemented, and for the sampling of the undersampled k-space data themselves, interference effects as well as geometric distortions can thus be avoided or reduced that would occur given different sampling diagrams for the acquisition of the reference data and the undersampled k-space data. An analogous sampling diagram is hereby defined in that, for two k-space lines sampled chronologically one after another, the separation in k-space in the acquired reference data in a repetition and undersampled data is the same; or, expressed in a different way, in that the reference data in a repetition have the same undersampling as the undersampled (imaging) data. However, the reference data from all repetitions in combination then, naturally, again yield a fully sampled k-space.

In a particularly effective embodiment of the method according to the disclosure for driving a magnetic resonance imaging system, an updating of the k-space data or reference data acquired with the modified first sampling diagram takes place at different points in time of the accelerated echoplanar imaging. The data basis for the supplementation of the undersampled k-space data can advantageously be adapted to dynamic effects, in particular interfering influences, for example phase changes or patient movements. This adaptation advantageously allows an image quality that is consistent over the entire course of the imaging process. For this purpose, a complete sampling of the reference data can take place up to a first point in time, and this complete sampling can be repeated once or multiple times at a later point in time. Graphically speaking, a sliding average of reference data can be calculated on the basis of the plurality of reference data sets, on the basis of which the k-space data to be supplemented are determined. Alternatively, a determination of "stable" or constant reference data can also take place after repeated acquisition of the reference data if an averaging over a plurality of reference data sets only takes place after acquisition of all reference data sets, or the reconstruction of the missing k-space data only takes place after the acquisition of all reference data sets.

If what are known as kernels are obtained, on the basis of the reference data, in order to determine the missing k-space data for the accelerated imaging, a plurality of such updated kernels may be obtained by means of a sliding averaging during an acquisition or imaging. This has the advantage of a consistently high image quality of the calculation of the missing k-space data, even given an occurrence of the mentioned dynamic interference effects.

Alternatively, a single stable kernel can be obtained at the end of the acquisition in that a portion of k-space required for the reference data, for example the k-space center, or a complete set of the reference data, is sampled or detected repeatedly in the course of the measurement, and the kernel is subsequently calculated on the basis of the averaged reference data.

In an especially practical embodiment of the method according to the disclosure, the modified first sampling diagram comprises at least four successive phase encoding gradients and at least three successive readout gradients with changing polarity, which alternate in time with the phase encoding gradients. Advantageously, at least three different k-space lines per repetition are acquired for the calculation of k-space data to compensate for the undersampling, whereby the image acquisition is accelerated.

The second through fourth phase encoding gradients thereby may comprise a positive polarity. In this variant, the sampling direction in the phase encoding direction is maintained in a repetition.

If k-space data should be acquired simultaneously in a plurality of slices, slice selection gradients may be switched synchronously with the second through fourth phase encoding gradients. The acquisition time of a magnetic resonance imaging can be advantageously reduced via the simultaneous acquisition.

The slice selection gradients thereby may have a changing polarity. This sampling diagram is particularly suitable for SMS, GRAPPA+SMS, or Dual Polarity GRAPPA imaging methods.

If an imaging method with an undersampling in the phase encoding direction is chosen, for example a GRAPPA diagram or a combination of a GRAPPA diagram and an SMS diagram, the amplitudes of the phase encoding gradients of the first modified sampling diagram may be chosen depending on an undersampling factor of the second sampling diagram. The amplitudes may be chosen so that, given an undersampling factor with value F (F is a natural number), F−1 lines are skipped over.

In an exemplary embodiment of the method according to the disclosure for driving a magnetic resonance imaging system, one of the following specific imaging techniques is used for the accelerated echoplanar acquisition:
GRAPPA,
SMS,
SENSE,
a combination of GRAPPA and SMS,
an acquisition with dual polarity,
a Compressed SENSING- or SENSE-based imaging method with a deep learning reconstruction method which likewise requires coil sensitivity information for execution.

A Compressed SENSING- or SENSE-based imaging method with a deep learning reconstruction method is described in Kerstin Hammernik et al., X-net: Systematic Evaluation of Iterative Deep Neural Networks for Fast Parallel MR Image Reconstruction, https://arxiv.org/abs/1912.09278.

Given imaging with a GRAPPA method, Nyquist ghosting correction lines can initially be obtained via the first sampling diagram, and reference lines for GRAPPA calculation—thus to calculate kernels to determine the k-space data supplementing an undersampling—are additionally obtained by applying the first modified sampling diagram. The selection of a partial segment of k-space to be acquired takes place via modification of the phase encoding gradients (Gy gradients), and the further movement within the navigator calculated by the first modified sampling diagram takes place by means of additional phase blips or smaller phase encoding gradients. With this method, a k-space with 24 phase encoding lines that is well suited to GRAPPA calibration can already be obtained with 8 repetitions given an acquisition of 3 phase encoding lines per repetition with the modified first sampling diagram. In addition to the calibration of GRAPPA kernels, the acquired k-space data can also be used for calibration of SENSE methods, and in particular to obtain coil sensitivity maps for deep learning reconstruction methods.

Given imaging with an SMS method, Nyquist ghosting correction lines can advantageously be obtained via the first sampling diagram, and reference lines for SMS calibration—thus for calculation of kernels to determine the k-space data supplementing an undersampling—can be obtained via the first modified sampling diagram. Reference lines for SMS kernel calibration are thus advantageously obtained.

In a specific embodiment of such a method which is based on the SMS sampling technique, reference data for the Slice GRAPPA kernel calculation are thereby determined. Slice GRAPPA is the prevalent reconstruction method for SMS acquisitions; see for example https://onlinelibrary.wiley.com/doi/full/10.1002/mrm.23097. The data points to be acquired are thereby chosen or arranged so that a slice-blip, such as a displacement of the data in the slice encoding direction (kz direction), can be dealt with. This procedure is more precisely described in the US patent specification U.S. Ser. No. 10/557,903 $B_2$.

If k-space points that are adjacent in the ky direction and kz direction are designated with successive whole numbers 1, 2, 3 etc., the data points kz=1/ky=1, kz=2/ky=2, kz=1/ky=3 are thus acquired given an acquisition of three phase encoding lines with the first sampling diagram given the modified first sampling diagram in the first repetition. This takes place via alternating blips in the kz direction and unipolar blips in the ky direction. Here, blips are gradient pulses that represent a short trajectory segment. In the following repetition, the complementary k-space segment kz=2/ky=1, kz=1/ky=2, kz=2/ky=3 is acquired. The polarity of the kz blips is hereby rotated accordingly. The acquisition of further partial segments subsequently takes place. Alternatively, the acquisition can also take place "by rows" in the kz direction, meaning that a single displacement along the kz axis is performed before the first echo, and then ky=1, 2, 3 is acquired with fixed kz values. As is described in the US patent specification U.S. Ser. No. 10/557,903 B2, slice-specific calibration data can then be achieved via Fourier transformation along the kz axis. In order to obtain a kernel with 24 k-space lines, here 16 repetitions are required given an acquisition of 3 phase encoding lines per repetition with the first sampling diagram.

Given imaging with a combined GRAPPA+SMS method, Nyquist ghosting correction lines can advantageously be obtained via the first sampling diagram, and reference lines for GRAPPA+SMS calibration—thus for calculating kernels to determine the k-space data supplementing an undersampling—are obtained via the first modified sampling diagram.

Reference lines for combined GRAPPA+SMS calibration are advantageously obtained. In this way, reference data can be obtained for both GRAPPA and SMS. Relative to a variant which is directed toward purely an SMS imaging method, this variant is modified to the effect that the separation of the phase encoding lines in the ky direction, i.e. in the phase encoding direction, respectively corresponds to the undersampling factor, for example 2. For calibration of what are known as the Slice GRAPPA kernels, the acquired k-space data are then rearranged according to DE 10 2017 209 988 $B_3$ so that the undersampled acquisition diagram is maintained. By contrast, to calibrate the conventional GRAPPA kernels, the phase encoding lines are accepted as a block, as was already described further above.

In the aforementioned different undersampling methods, other arrangements of the k-space points acquired in the repetitions are also conceivable as long as a completely sampled k-space region is achieved in the end.

For a GRAPPA+SMS calibration, 32 repetitions are already required for two kernels with 24 k-space lines each given an acquisition of 3 phase encoding lines per repetition with the first sampling diagram.

If the second sampling diagram comprises a sampling with dual polarity, for example given a Dual Polarity GRAPPA imaging method, the first modified sampling diagram comprises at least two sampling diagrams with readout polarity inverted with respect to one another for each sampled phase. For this purpose, two successive repetitions may be used with differently modified first sampling diagrams with readout polarity of the phase encoding gradients that is inverted with respect to one another, and otherwise identical gradient diagram. In comparison to a standard GRAPPA method, in this first sub-variant the number of repetitions that is required for the determination of the reference data is doubled.

In a second sub-variant of the Dual Polarity GRAPPA imaging method, the acquisition of the k-space data takes place with the modified first sampling diagram with readout polarity inverted relative to one another, in that each phase is sampled multiple times, preferably three times, with changing polarity. In this sub-variant, only the acquisition of one phase encoding line thus takes place in the acquisition of the reference data per repetition, such that the number of repetitions required for the acquisition of the reference data is tripled given an unmodified first sampling diagram with an acquisition of three phase encoding lines per repetition for an acquisition of Nyquist ghost correction data.

If, in the method according to the disclosure as an accelerated EPI imaging method, an imaging method for simultaneous readout of a plurality of slices is used, for example the aforementioned imaging methods, in a particularly effectively realizable embodiment of the method the number N of slices to be read out simultaneously is equal to 2.

Alternatively, the number N of slices to be read out simultaneously can also be equal to 3. In principle, it would be optimal to simultaneously read out as many slices as possible. However, the number of slices to be read out simultaneously is limited by the following circumstances: the energy supplied to the patient per pulse is proportional to the number of slices N. However, the energy supply that is allowed per unit of time is thereby limited. Moreover, the separation in the image reconstruction becomes more difficult the more slices that are read out simultaneously, since the noise in the separated images increases. This increase has a non-linear response. Therefore, in practice it is only possible to read out a few slices simultaneously.

Figure 1:
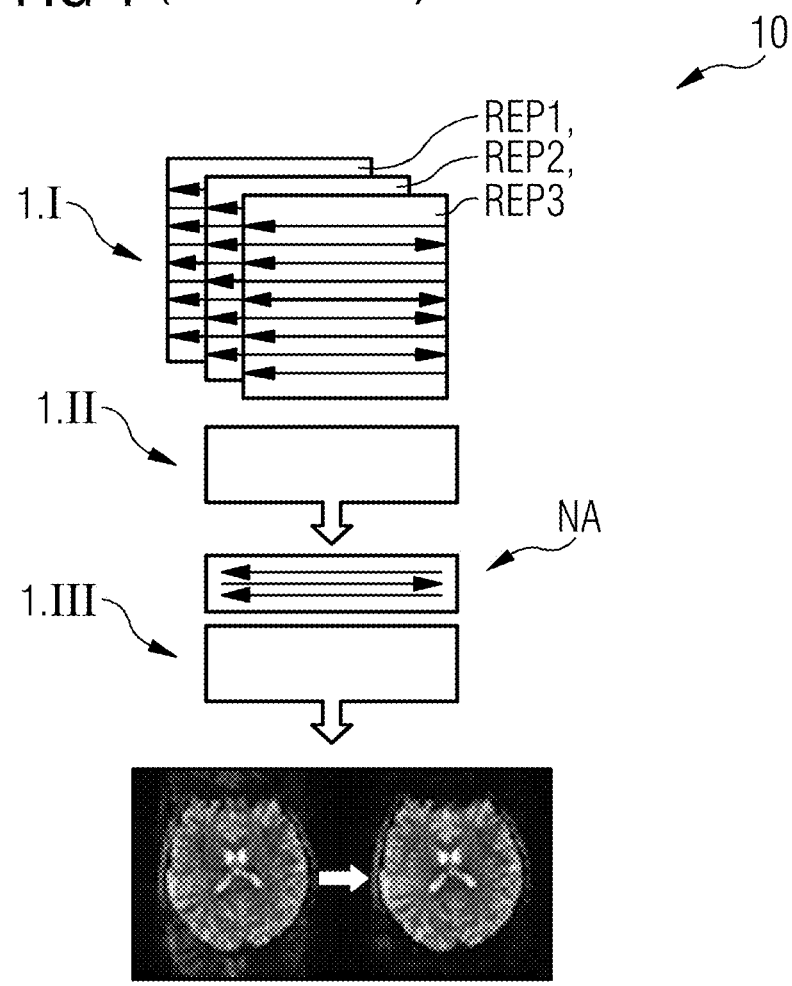
FIG. 1 illustrates a conventional procedure for a Nyquist ghost correction.

Shown in FIG. 1 is a graphical representation 10 with a flow diagram which illustrates a conventional procedure for an implementation of a Nyquist ghost correction in a magnetic resonance imaging method. In step 1.I, three phase encoding lines in the k-space center are acquired in the first three repetitions REP1, REP2, REP3 within the scope of a phase correction acquisition. The unencoded phase encoding lines that are acquired in the k-space center in the first three repetitions REP1, REP2, REP3 are subsequently averaged in step 1.II so that k-space data for a navigator acquisition NA are obtained. On the basis of these averaged k-space data, in step 1.III Nyquist ghost effects are corrected or eliminated from image data. This step 1.III is also symbolized by a graphical depiction below the flow diagram, wherein the artifact-affected graphical depiction of a brain is shown on the left in the image, and the corrected graphical depiction is illustrated on the right in the image. In this conventional variant, the Nyquist ghost correction lines are sampled only in the first three repetitions, and the obtained correction factors are subsequently applied to all other repetitions of the actual imaging method. The method for correction of Nyquist ghost effects that is illustrated in FIG. 1 is explained in detail in US 604 365 1 $B_2$.

At this point, it is to be noted that it is also conventionally typical to sample three respective, unencoded k-space lines with changing polarity as navigator data in each repetition, before the sampling of the k-space data for the imaging. The variant described in FIG. 1 is adapted to the obtaining of phase-encoded k-space lines to obtain $B_0$ field maps, as described in FIG. 2. In this specific instance, the repetitions REP4, . . . , REPM illustrated in FIG. 2 are subsequent to the first three repetitions REP1, REP2, REP3 illustrated in FIG. 1.

Figure 2:
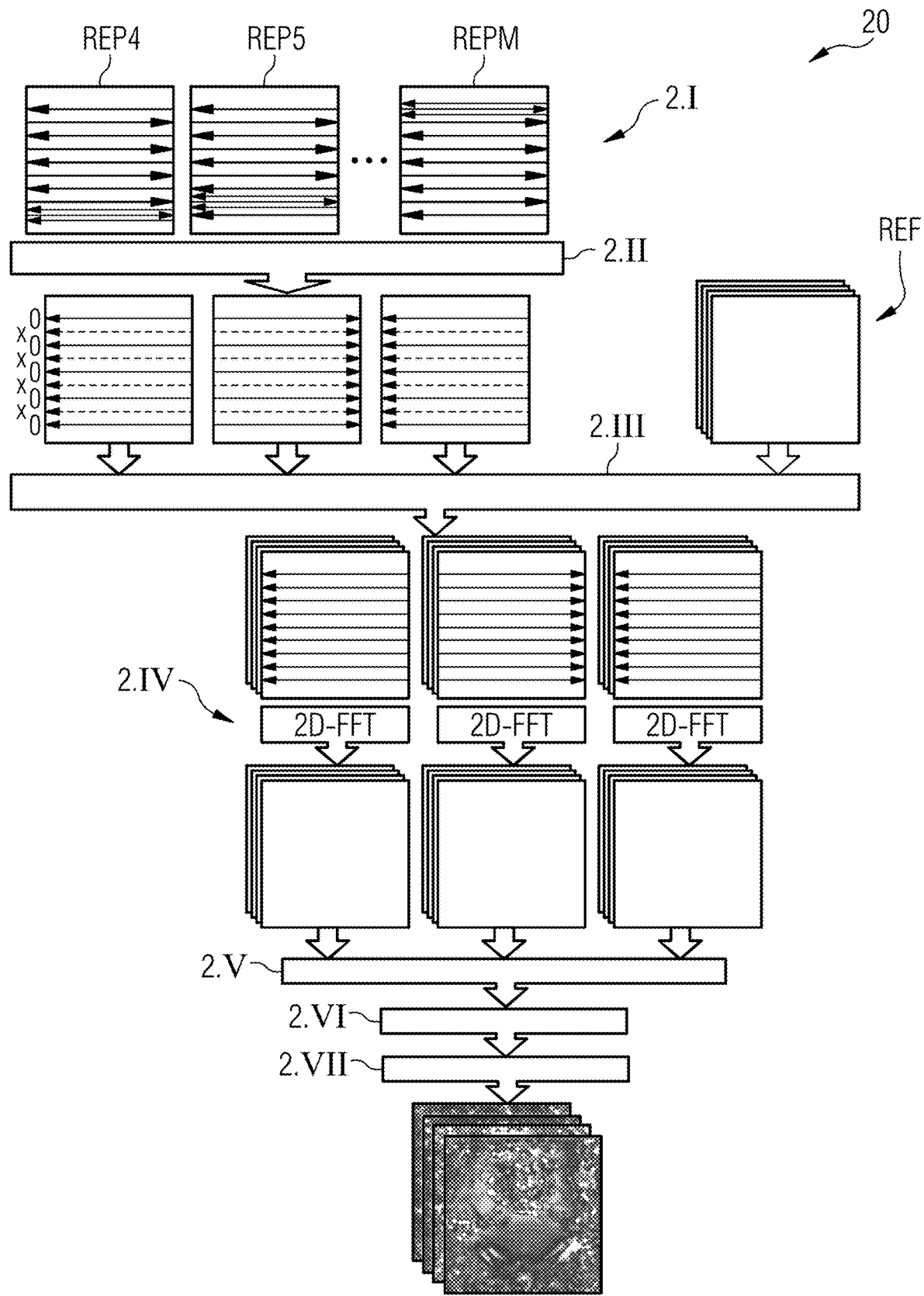
FIG. 2 illustrates a conventional method for determining $B_0$ field maps, in which a different k-space segment to be acquired is encoded using phase encoding gradients in each repetition, which is subsequently assembled into matching k-spaces.

In FIG. 2, a graphical representation 20 is shown which illustrates a conventional method for image-based determination of field maps. The method illustrated in FIG. 2 corresponds to the procedure in Chi et al., "Field-Mapping-Embedded EPI for Geometric Distortion Correction," Proc. Intl. Soc. Mag. Reson. Med. 30 (2022) 1099.

In this method, a different k-space segment to be acquired is encoded by means of phase encoding gradients in each repetition, which k-space segment is subsequently assembled into matching k-spaces (see steps 2.I, 2.II). In step 2.I, a series of repetitions REP4, REP5, . . . , REPM take place in which k-space data, or raw data, of the examination subject are acquired per slice with different phase encoding within the scope of an echoplanar imaging. In a deviation from the method illustrated in FIG. 1, in addition to undersampled k-space data for the imaging in each repetition, a phase encoding line for the creation of a later field map is also acquired, wherein a different phase is encoded for each repetition. In step 2.II, the undersampled k-space lines acquired in step 2.I are rearranged. Moreover, in step 2.II an additional acquisition of reference data REF takes place, which reference data are used later for a calibration of kernels for a determination of k-space data that are missing in the acquisition of the k-space data in step 2.I. At this point, it should be explicitly noted that the acquisition of the reference data takes place in a separate acquisition. Two separate acquisitions are thus performed: one acquisition to acquire the undersampled k-space data and the phase encoding lines, and a separate acquisition of the reference data REF.

A determination of the missing k-space data for the respective slices subsequently takes place in step 2.III on the basis of the kernels determined in step 2.II and the undersampled k-space data.

Per-layer image reconstructions take place in step 2.IV with the aid of a two-dimensional fast Fourier transformation (2D-FFT) on the basis of the completed k-space data.

In step 2.V, a calculation of a phase difference (for example the phase expansion between the first and third echo $\Delta\varphi_{31}$ which are acquired with the same polarity) and a total phase offset $\varphi_0$ takes place on the basis of the plurality of reconstructed slice images.

In step 2.VI, the image data of the individual channels are subsequently combined, and in step 2.VII an unwrapping of phases takes place to create the field maps. A correction of phase jumps in the image therewith takes place. In that the phase is periodic, with 360 degrees, ambiguities can occur between pixels (i.e., one phase difference will be 0, the adjacent will be 360°).

Figure 3:
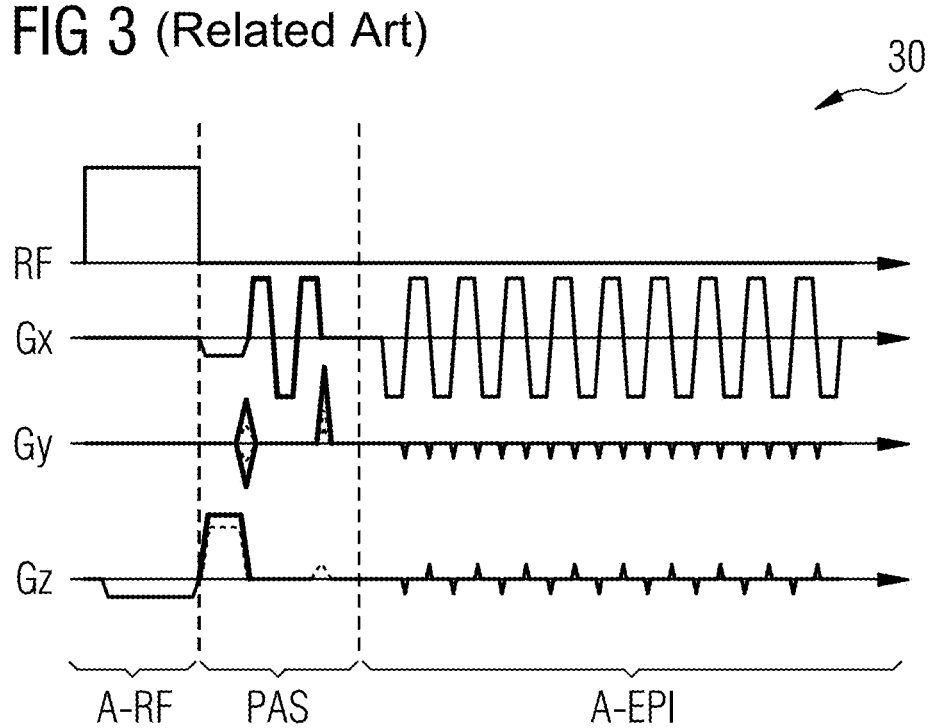
FIG. 3 illustrates a pulse sequence series for implementation of the imaging method illustrated in FIG. 2.

Shown in FIG. 3 is a graphical representation 30 that illustrates a pulse sequence series for implementation of the method illustrated in FIG. 2 for image-based determination of field maps. The graphical representation comprises four partial graphical representations depicted one below another, wherein the first partial graphical representation shows an excitation radio frequency pulse RF, the second partial graphical representation shows a series of readout gradients Gx, the third partial graphical representation shows a series of phase encoding gradients Gy, and the fourth partial graphical representation depicts a series of slice selection gradients Gz. At this point it should be noted that, in this representation, the received radio frequency pulses which represent the received measurement signals are not illustrated.

Shown to the left in the graphical representation is an excitation diagram A-RF having an RF excitation pulse RF and a slice selection gradient Gz performed simultaneously therewith.

Depicted in the middle of the graphical representation, between two vertically traveling dashed lines, is a sampling diagram PAS for sampling phase-shifted phase encoding lines for a navigator acquisition NA to acquire k-space data for a Nyquist ghosting correction. Initially, a frequency encoding gradient Gx, a slice selection gradient Gz, and a phase encoding gradient Gy are switched simultaneously for the positioning of a desired starting position in k-space. Three frequency encoding gradients Gx that alternate with respect to their polarity are subsequently switched. Within the scope of the generation of the phase correction data, the polarity of the readout gradients is mirrored in the kx direction by means of a change of the polarity of the readout gradients on the axis in the direction of the readout gradients Gx, which is necessary to obtain three unipolar k-spaces for the later image-based calculation of the field maps.

A phase encoding gradient Gy and a slice selection gradient Gz are switched to conclude the middle sampling diagram PAS.

Set to the right of this is an EPI pulse sequence EPI with a Slice GRAPPA sampling diagram.

Figure 4:
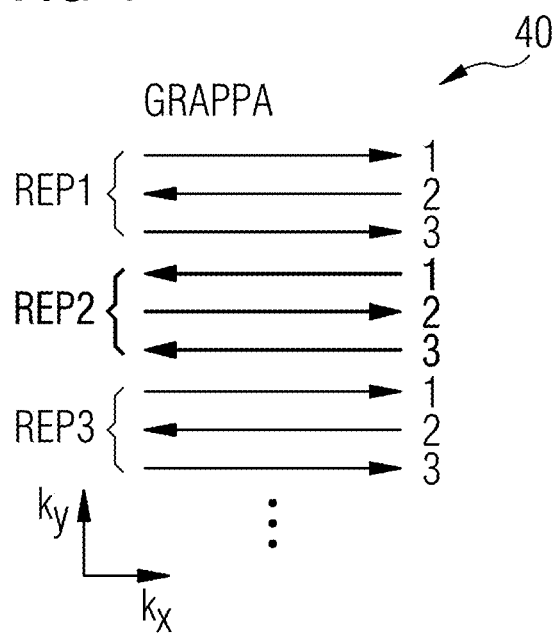
FIG. 4 illustrates a diagram for obtaining reference lines for GRAPPA calibration in a method for driving a magnetic resonance imaging system to generate magnetic resonance image data of an examination subject, in which k-space data are acquired with an undersampling within the scope of an accelerated echoplanar imaging, according to an exemplary embodiment of the disclosure.

Depicted in FIG. 4 is a diagram 40 for obtaining reference lines for GRAPPA calibration in a method for driving a magnetic resonance imaging system to generate magnetic resonance image data of an examination subject, in which k-space data are acquired within the scope of an accelerated echoplanar imaging with a GRAPPA undersampling, according to an exemplary embodiment of the disclosure.

As was already explained in detail in the generalized part, within the scope of the method according to the disclosure, a first sampling diagram (not shown) is used for the unencoded acquisition of three phase encoding lines for a correction of Nyquist ghost effects, and a corresponding pulse sequence is executed in a first repetition within the scope of an imaging process. For the following repetitions, the sampling diagram as depicted in FIG. 4 is now modified.

Figure 5:
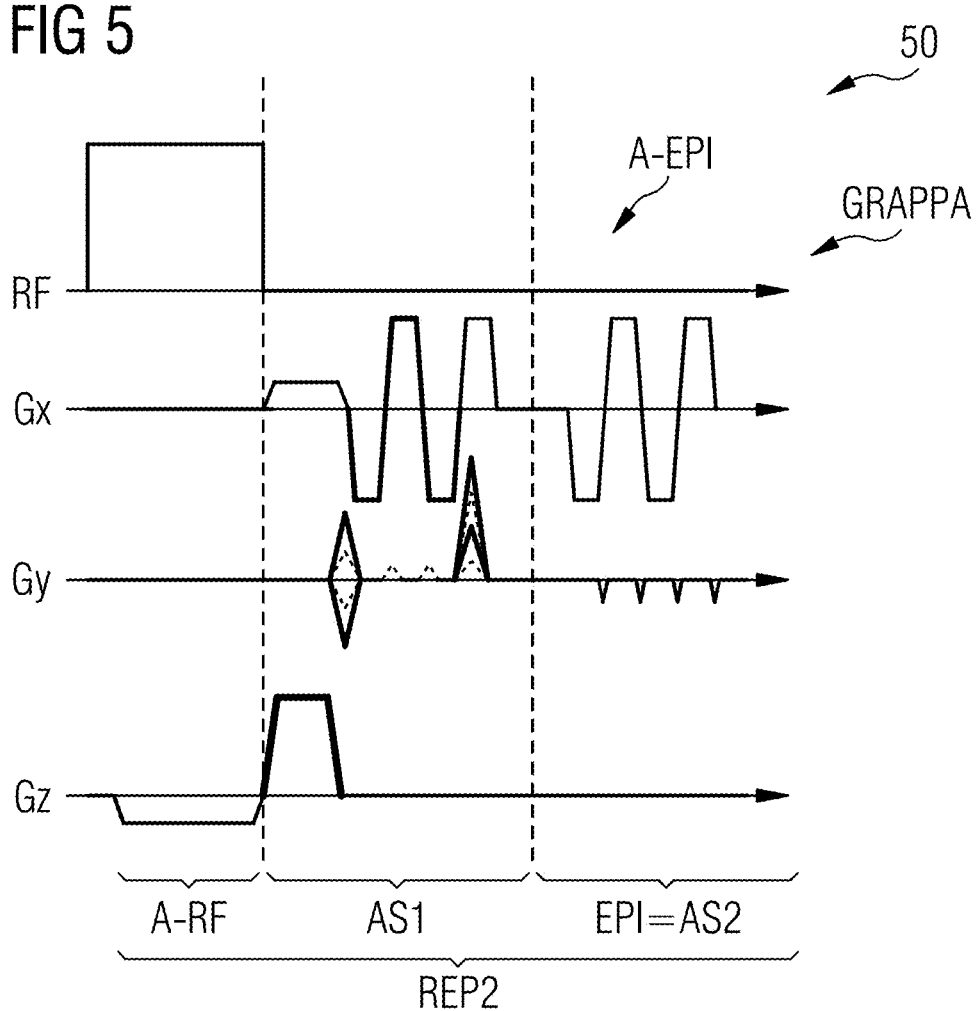
FIG. 5 illustrates of a pulse sequence series for implementing the sampling diagram illustrated in FIG. 4 in an echoplanar imaging method, according to an exemplary embodiment of the disclosure.

For this purpose, the first acquisition diagram for obtaining reference lines for kernels which are required for a determination of missing data due to the undersampling in the GRAPPA imaging method is modified to the effect that what are known as phase blips or phase encoding gradients are added. The selection of a partial segment REP1, REP2, REP3 of k-space to be acquired takes place via the phase encoding gradients, or Gy gradients, already shown in FIG. 3, and a further movement between the individual phase encoding lines of a repetition takes place by means of additional phase blips that are illustrated in FIG. 5. With this method, a k-space with 25 phase encoding lines that is already well suited to GRAPPA calibration can already be obtained with eight repetitions.

In FIG. 5, a graphical representation 50 is shown that shows a pulse sequence series for implementation of the sampling diagram illustrated in FIG. 4 in an echoplanar imaging method. First, the excitation diagram A-RF that has already been illustrated in FIG. 3 is depicted in the graphical representation 50 illustrated in FIG. 5. The following, modified first sampling diagram AS1, arranged between dashed vertical lines, reflects the second repetition REP2 depicted in FIG. 4, with which reference data should be acquired. For positioning at the starting point of the trajectory of the second repetition REP2 as depicted in FIG. 4, first a frequency encoding gradient Gx, a slice selection gradient Gz, and a phase encoding gradient Gy are executed simultaneously. The phase encoding gradients Gy that are drawn one atop another with different amplitude at the same point (one solid and one with dashed line) are thereby associated with different repetitions. Depending on the amplitude strength, a different phase in k-space is activated in different repetitions. Similar to as given the pulse sequence depicted in FIG. 3, three frequency encoding gradients Gx with changing polarity subsequently follow, which are respectively followed by a small second or third phase encoding gradient Gy referred to as a phase blip. Finally, the modified first excitation diagram AS1 is concluded by an additional frequency encoding gradient Gx and, simultaneously therewith, a fourth phase encoding gradient Gy, in order to arrive at the starting point of the trajectory forming the echo train of the actual EPI pulse sequence EPI for the echoplanar imaging A-EPI. Here as well, the phase encoding gradient Gy concluding the modified first sampling diagram is drawn again with a plurality of phase encoding gradients Gy drawn over one another, which respectively have different amplitudes and are associated with different repetitions. The EPI pulse sequence EPI represents a second sampling diagram AS2 and, similar to the first sampling diagram AS1 modified by the increase phase encoding gradients Gy, has uniform, but negatively polarized, phase encoding gradients Gy.

It is to be noted that, in the exemplary embodiment illustrated in FIG. 5, an unmodified repetition (not shown) precedes the repetitions REP1, . . . , REP3 also shown in FIG. 4, with which unmodified repetition three unencoded phase space lines are recorded with changing polarity as navigator data for a Nyquist ghost correction. In these preceding repetitions, the phase encoding gradients drawn in the first sampling diagram in FIG. 5—in particular the second and third phase encoding gradients, also referred to as phase blips—are omitted, since the acquisition of the navigator data takes place without encoding. In contrast to the conventional method illustrated in FIG. 2, the acquisition of the navigator data, the reference data, and the k-space data thus takes place for the echoplanar imaging with a single pulse sequence and a joint acquisition. As was already mentioned in the preceding, the total acquisition time can be reduced via the integration of the acquisition of the reference data into the acquisition process of the echoplanar imaging.

Figure 6:
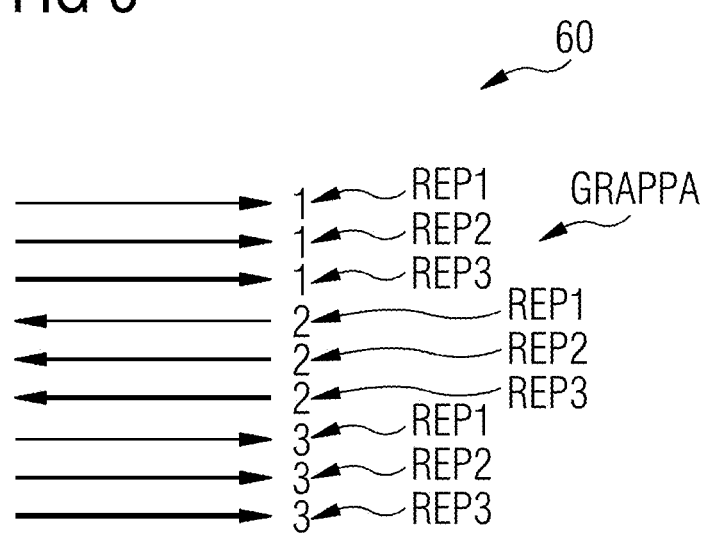
FIG. 6 illustrates a diagram for obtaining reference lines for GRAPPA calibration in a method for driving a magnetic resonance imaging system to generate magnetic resonance image data of an examination subject, in which k-space data are acquired with an undersampling within the scope of an accelerated echoplanar imaging, according to an exemplary embodiment of the disclosure.

Presented in FIG. 6 is an alternative diagram 60 for obtaining reference lines for GRAPPA calibration in a method for driving a magnetic resonance imaging system to generate magnetic resonance image data of an examination subject, in which k-space data are acquired with an undersampling within the scope of an accelerated echoplanar imaging, according to an exemplary embodiment of the disclosure. In deviation from the diagram 40 shown in FIG. 4, the successive phase encoding lines of a repetition REP1, REP2, REP3 are respectively arranged offset by three phase encoding lines.

Figure 7:
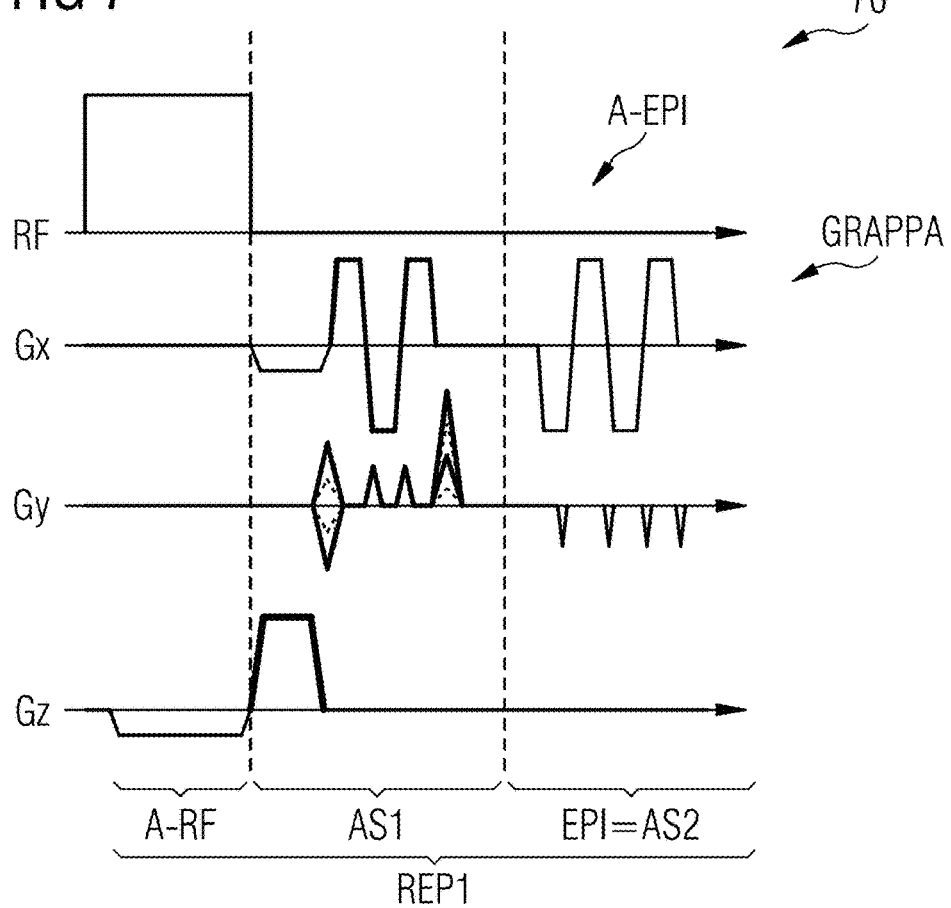
FIG. 7 illustrates a pulse sequence series for implementing the sampling diagram illustrated in FIG. 6 in an echoplanar imaging method, according to an exemplary embodiment of the disclosure.

A graphical representation 70 with a pulse sequence series for implementation of the sampling diagram illustrated in FIG. 6 is shown in FIG. 7 in an echoplanar imaging method.

In FIG. 7, the excitation diagram A-RF that was already illustrated in FIG. 3 and FIG. 5 is initially depicted. The modified first sampling diagram AS1 that follows thereon reflects the first repetition REP1 depicted in FIG. 6. For positioning at the start point of the trajectory of the first repetition REP1, as depicted in FIG. 6, firstly a frequency encoding gradient Gx, a slice selection gradient Gz, and a phase encoding gradient Gy are executed simultaneously. Similarly, to as in the pulse sequence depicted in FIG. 5, three frequency encoding gradients Gx with changing polarity subsequently follow, wherein a phase encoding gradient Gy (referred to as a phase blip) respectively follows the first two frequency encoding gradients Gx. In comparison to the corresponding phase encoding gradients Gy shown in FIG. 5, this phase encoding gradient has an area three times greater, since it is used to jump over two adjacent phase encoding lines. Finally, the modified first excitation diagram AS1 is concluded by an additional phase encoding gradient in order to arrive at the starting point of the trajectory forming the actual EPI pulse sequence EPI. The EPI pulse sequence EPI represents a second sampling diagram AS2 and—similar to the first sampling diagram AS1 modified by the increased phase encoding gradients Gy—has uniform, but negatively polarized, phase encoding gradients.

Figure 8:
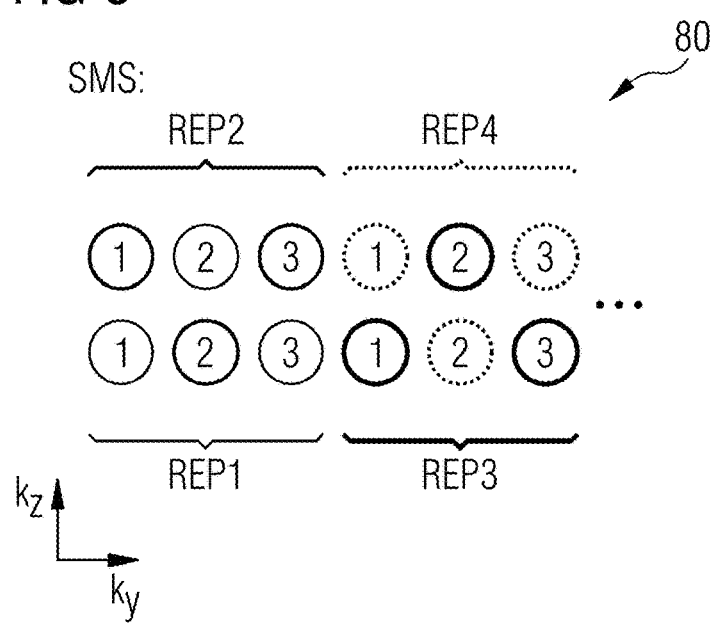
FIG. 8 illustrates a diagram for obtaining reference lines for SMS calibration in a method for driving a magnetic resonance imaging system to generate magnetic resonance image data of an examination subject, in which k-space data are acquired with an undersampling within the scope of an accelerated echoplanar imaging, according to an exemplary embodiment of the disclosure.

A diagram 80 for obtaining reference lines for SMS calibration in a method for driving a magnetic resonance imaging system to generate magnetic resonance image data of an examination subject, in which k-space data are acquired within the scope of an accelerated echoplanar imaging with an SMS undersampling, according to an exemplary embodiment of the disclosure, is depicted in FIG. 8.

Reference data for the Slice GRAPPA kernel calculation in an SMS imaging are shown. The data points to be acquired are depicted here so that a slice blip Gz can be treated as a displacement of the data in the kz direction (cf. U.S. Ser. No. 10/557,903 B$_2$). The data points kz=1/ky=1, kz=2/ky=2, kz=1/ky=3 are thus acquired in the first repetition REP1. The order of the sampling of the different k-space lines within a repetition is symbolized with the numbers 1, 2, 3 associated with these k-space lines. This takes place in FIG. 9 via alternating blips Gz in the kz direction and unipolar blips Gy in the ky direction.

The complementary k-space segment kz=2/ky=1, kz=1/ky=2, kz=2/ky=3 is acquired in the second repetition REP2. The polarity of the kz blips Gz is hereby rotated accordingly. The acquisition of further partial segments of k-space subsequently takes place with the third repetition REP3 and the fourth repetition REP4.

Alternatively, the acquisition can also take place "by rows" in the kz direction, meaning that an individual displacement along kz is performed before the first echo, and then ky=1, 2, 3 are acquired with fixed kz. As described in U.S. Ser. No. 10/557,903 $B_2$, slice-specific calibration data can then be achieved via Fourier transformation along kz. Here, 16 repetitions are required in order to obtain a kernel with 24 k-space lines.

Figure 9:
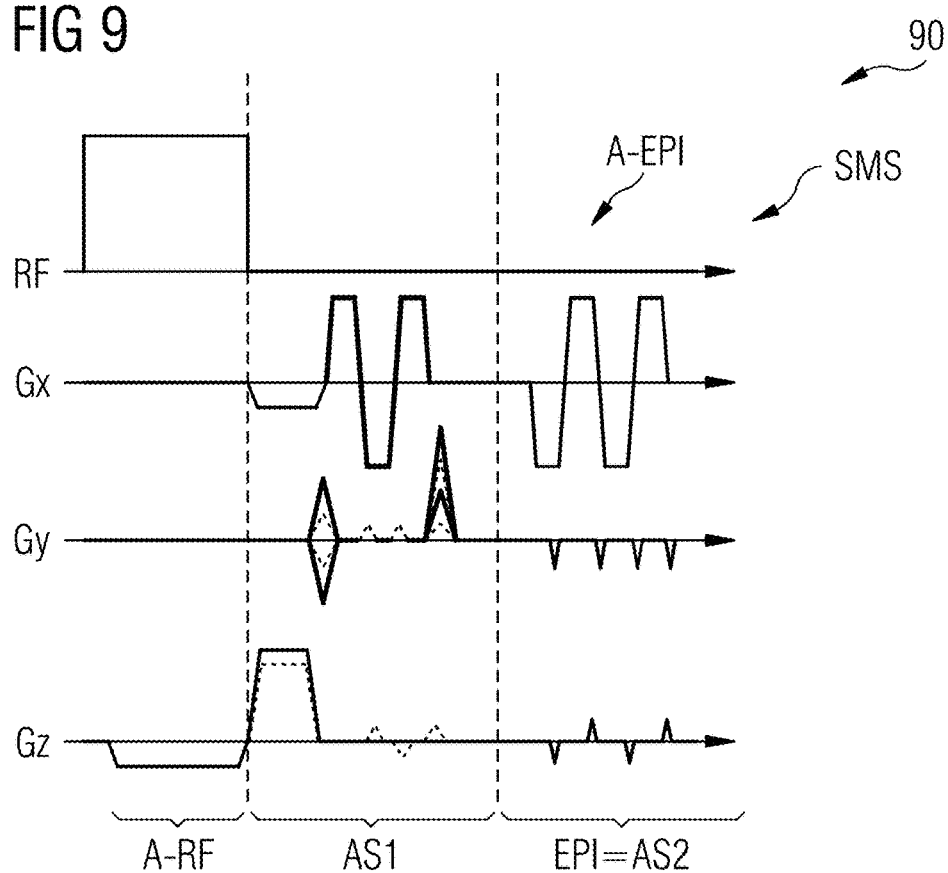
FIG. 9 illustrates a pulse sequence series for implementing the sampling diagram illustrated in FIG. 8 in an echoplanar imaging method, according to an exemplary embodiment of the disclosure.

A graphical representation 90 with a pulse sequence series for implementation of the sampling diagram illustrated in FIG. 8 in an echoplanar imaging method is shown in FIG. 9.

Shown first in FIG. 9 is the excitation diagram A-RF already illustrated in FIG. 3, FIG. 5, and FIG. 7. The modified first sampling diagram AS1 following this reflects the first repetition REP1 depicted in FIG. 8. First, a frequency encoding gradient Gx, a slice selection gradient Gz, and a phase encoding gradient Gy are executed simultaneously for positioning at the start point of the trajectory of the first repetition REP1 as depicted in FIG. 8. Similarly, to as given the pulse sequence depicted in FIG. 7, three frequency encoding gradients Gx with changing polarity subsequently follow, wherein a positively polarized phase encoding gradient Gy (referred to as a phase blip) respectively follows the first two frequency encoding gradients Gx. In comparison to the corresponding phase encoding gradients Gy shown in FIG. 7, this phase encoding gradient Gy has only one-third the area, since it is used to activate adjacent phase encoding lines. Alternating polarized slice selection gradients Gz are switched simultaneously with the phase encoding gradients Gy referred to as phase blips.

Finally, the modified first excitation diagram AS1 is concluded by an additional phase encoding gradient Gy, with which a last slice selection gradient Gz is simultaneously switched, in order to arrive at the starting point of the trajectory forming the echo train of the actual EPI pulse sequence EPI. The EPI pulse sequence EPI represents a second sampling diagram AS2 and, similarly to the modified first sampling diagram AS1, has a modified sampling diagram that is characterized by uniform, but negatively polarized, phase encoding gradients Gy and slice selection gradients Gz changing their polarization.

Figure 10:
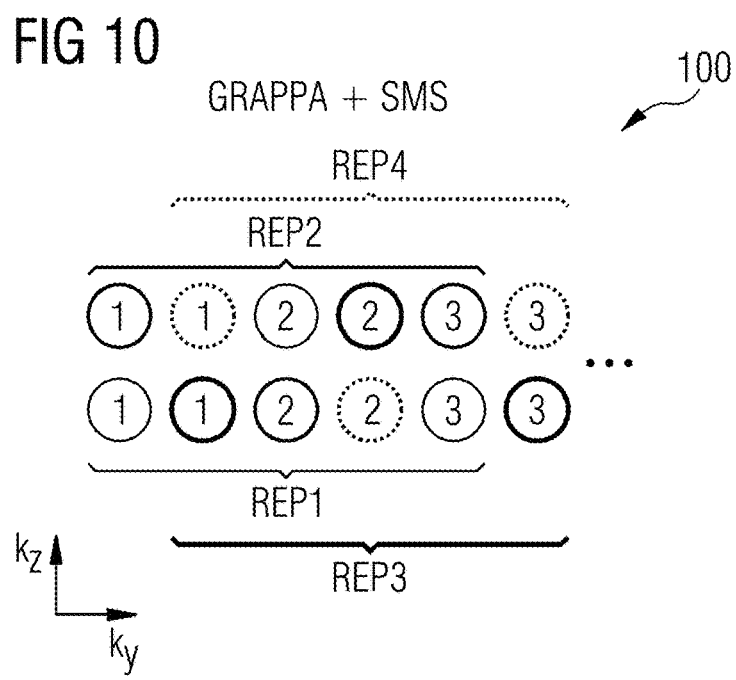
FIG. 10 illustrates a diagram for obtaining reference lines for combined GRAPPA+SMS calibration in a method for driving a magnetic resonance imaging system to generate magnetic resonance image data of an examination subject, in which k-space data are acquired with an undersampling within the scope of an accelerated echoplanar imaging, according to an exemplary embodiment of the disclosure.

A diagram 100 for obtaining reference lines for combined GRAPPA+SMS calibration in a method for driving a magnetic resonance imaging system to generate magnetic resonance image data of an examination subject, in which k-space data are acquired within the scope of an accelerated echoplanar imaging with an undersampling, is shown in FIG. 10 according to an exemplary embodiment of the disclosure.

With the method illustrated in FIG. 10, reference data are obtained for both GRAPPA and SMS. Relative to the sampling diagram 80 illustrated in FIG. 8, the method is modified to the effect that the separation in the ky direction respectively corresponds to the undersampling factor (here 2). The pattern of the lines (dotted, thin, medium, thick) of the brackets associated with the individual repetitions REP1, . . . , REP4 corresponds to the pattern of the contour lines of the k-space lines associated with the respective repetitions. For calibration of the Slice GRAPPA kernels, the acquisition data are then arranged according to DE 10 2017 209 988 $B_3$ so that the undersampled acquisition diagram is maintained. For calibration of the conventional GRAPPA kernels, the lines are adopted as a block. As in the method illustrated in FIG. 8, here other arrangements of the k-space points acquired in the repetitions REP1, REP2, REP3, REP4 are conceivable, as long as a fully sampled region is achieved in the end. Here, 32 repetitions are already required for two kernels with 24 k-space lines each.

Figure 11:
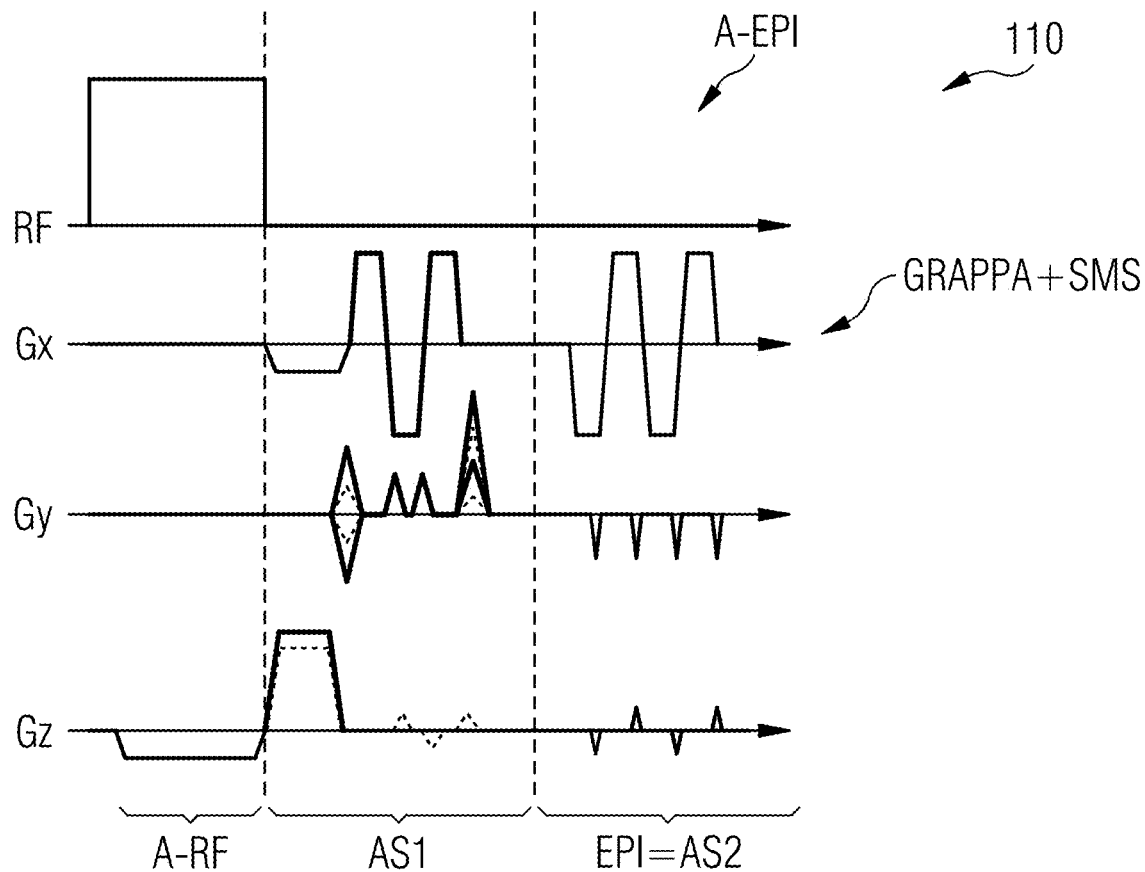
FIG. 11 illustrates a pulse sequence series for implementing the sampling diagram illustrated in FIG. 10 in an echoplanar imaging method, according to an exemplary embodiment of the disclosure.

A graphical representation 110 that shows a pulse sequence series for implementing the imaging method illustrated in FIG. 10 is illustrated in FIG. 11.

Shown first in FIG. 11 is the excitation diagram A-RF already illustrated in FIG. 3, FIG. 5, FIG. 7, and FIG. 9. The modified first sampling diagram AS1 following this reflects the first repetition REP1 depicted in FIG. 10. First, a frequency encoding gradient Gx, a slice selection gradient Gz, and a phase encoding gradient Gy are executed simultaneously for positioning at the start point of the trajectory of the first repetition REP1 as depicted in FIG. 10. Similarly, to as in the pulse sequence depicted in FIG. 9, three frequency encoding gradients Gx with changing polarity subsequently follow, wherein a positively polarized phase encoding gradient Gy (referred to as a phase blip) respectively follows the first two frequency encoding gradients Gx. In comparison to the corresponding phase encoding gradients Gy shown in FIG. 9, this phase encoding gradient Gy has twice the area, since it is used to jump over a respective phase encoding line in the ky direction and activate the next phase encoding line after that. Alternating polarized slice selection gradients Gz are switched simultaneously with the phase encoding gradients Gy referred to as phase blips.

Finally, the modified first excitation diagram AS1 is concluded by an additional phase encoding gradient Gy, with which a last slice selection gradient Gz is simultaneously switched, in order to arrive at the starting point of the trajectory forming the echo train of the actual EPI pulse sequence EPI. The EPI pulse sequence EPI represents a second sampling diagram AS2 and, similarly to the modified first sampling diagram AS1, has a modified sampling diagram that is characterized by uniform, but negatively polarized, phase encoding gradients Gy and slice selection gradients Gz changing their polarization.

Shown in FIG. 12 is a diagram 120 for obtaining reference lines of a first kernel for a Dual Polarity GRAPPA calibration in a method for driving a magnetic resonance imaging system to generate magnetic resonance image data of an examination subject, in which k-space data are acquired within the scope of an accelerated echoplanar imaging with an undersampling, according to an exemplary embodiment of the disclosure. The sampling of k-space for the first kernel takes place very analogously to the sampling diagram 40 shown in FIG. 4, and therefore is not again explained in detail.

Depicted in FIG. 13 is a graphical representation that shows a pulse sequence series for implementing the sampling diagram 120 illustrated in FIG. 12. The pulse sequence depicted in FIG. 13 is structured analogously or identically to the pulse sequence 50 depicted in FIG. 5, and therefore is not again explained in detail.

Shown in FIG. 14 is a diagram 140 for obtaining reference lines of a second kernel for a Dual Polarity GRAPPA calibration in a method for driving a magnetic resonance imaging system to generate magnetic resonance image data of an examination subject, in which k-space data are acquired within the scope of an accelerated echoplanar imaging with an undersampling, according to an exemplary embodiment of the disclosure. In FIG. 14, the sampling direction of the phase encoding lines takes place precisely inversely to the sampling diagram 120 shown in FIG. 12.

Depicted in FIG. 15 is a graphical representation 150 that shows a pulse sequence series of the sampling diagram illustrated in FIG. 14. The pulse sequence depicted in FIG. 15 differs from the pulse sequence depicted in FIG. 13 only in that the readout gradients Gx of the modified sampling diagram AS1 have a polarity that is inverted in comparison to FIG. 13, and a fourth readout gradient Gx is omitted in the modified first sampling diagram AS1.

As described by Chi et al., "Field-Mapping-Embedded EPI for Geometric Distortion Correction," Proc. Intl. Soc. Mag. Reson. Med. 30 (2022) 1099, in the illustrated acquisition diagrams, an unencoded navigator acquisition, or an acquisition for a Nyquist ghost correction, should initially be performed—preferably in advance—with a first unmodified sampling diagram in order to furthermore enable a ghosting correction. Also suitable for this is a combination with the already addressed ghosting correction method for an SMS imaging (see U.S. Ser. No. 10/162,037 $B_2$ or U.S. Ser. No. 11/280,870 $B_2$). If only one such acquisition for ghosting corrections is performed, the correction occurs statically as in a conventional "external phase correction scan," meaning that dynamic variations cannot enter into it. Since drift effects normally develop slowly over time, the interspersing of these acquisitions—for example all eight repetitions and an update for ghosting correction factors, for example by means of a sliding average—is effective in order to compensate for these slow drift effects.

As was already explained, it is likewise conceivable to obtain a plurality of GRAPPA and/or SMS kernels given very long image acquisitions, for example by means of a sliding average. This has the advantage of a consistently high image quality even given disruptive influences such as phase changes or patient movements. Alternatively, a stable kernel can be obtained in that a portion (for example the k-space center) or the complete calibration k-space is sampled multiple times in the course of the measurement, and the calibration takes place on all averaged data. The acquisition diagrams outlined in the Figure description were described based on a navigator acquisition consisting of three lines. This has the advantage that no variation of repetition time TR and echo time TE results due to the modification. However, a minimum number of repetitions is necessary in order to obtain complete data sets. Naturally, it is also conceivable to increase the number of navigator lines while accepting a slight increase in the echo time TE, and potentially of the repetition time TR, in order to obtain more reference lines per repetition.

A magnetic resonance system 160 (shortened in the following to "MR system") is presented in a roughly schematic manner in FIG. 16. It comprises on the one hand the actual magnetic resonance scanner 102 with an examination space 103, or patient tunnel, into which a patient or examination subject O on a bed 108 can be driven, in the body of which patient or examination subject O is located a specific organ to be imaged, for example.

The magnetic resonance scanner 102 is equipped in a typical manner with a basic field magnet system 104, a gradient system 106, and an RF transmitting antenna system 105 and an RF receiving antenna system 107. In the presented exemplary embodiment, the RF transmitting antenna system 105 is a whole body coil permanently installed in the magnetic resonance scanner 102, by contrast to which the RF receiving antenna system 107 consists of local coils to be arranged on the patient or test subject (symbolized in FIG. 16 by only a single local coil). However, in principle the whole body coil of the RF transmitting antenna system can also be used as an RF receiving antenna system, and the local coils 107 can also be used as an RF transmitting antenna system, insofar as these coils can respectively be switched into different modes of operation.

Furthermore, the MR system 160 has a central control device (central controller) 113 that is configured to control the MR system 160. This central control device 113 may comprise a sequence control unit (sequence controller) 114 for pulse sequence control. With this, the chronological order of radio frequency pulses (RF pulses) and gradient pulses is controlled depending on a selected imaging sequence PS according to a pulse sequence diagram PSS. Such an imaging sequence PS, or the pulse sequence diagram PSS forming the basis of the imaging sequence PS, can, for example, be provided within a measurement or control protocol P. Various control protocols P for different measurements are typically stored in a memory 119, and can be selected by an operator (and possibly modified as needed) and then be used to implement the measurement. The sequence control unit 114 may also comprise an activation sequence determination device (activation sequence generator) 91 according to the disclosure. The activation sequence determination device 91 may be configured to generate control data SD which enable the order of excitation modules and readout modules shown in FIG. 5, FIG. 7, FIG. 9, FIG. 11, FIG. 13, or FIG. 15 that the sequence control unit 114 outputs to the pulse sequence controller 114.

To output the individual RF pulses, the central control device 113 has a radio frequency transmission device (RF transmitter) 115 that is configured to generate the RF pulses, amplifies them, and feeds them into the RF transmitting antenna system 105 via a suitable interface (not depicted in detail). The control device 113 has a gradient system interface 116 to control the gradient coils of the gradient system 106. The sequence control unit 114 communicates in a suitable manner (for example by transmitting sequence control data SD) with the radio frequency transmission device 115 and the gradient system interface 116 to emit the pulse sequences PS in the order generated by the activation sequence determination device 91. Moreover, the control device 113 has a radio frequency reception device (RF receiver) 117 (likewise communicating with the sequence control unit 114 in a suitable manner) in order to acquire magnetic resonance signals received as coordinated by the RF transmitting antenna system 107. A reconstruction unit (reconstructor) 118 accepts the acquired data as raw data, or k-space data, RD after demodulation and digitization, and reconstructs the MR image data from these. These image data BD can then be stored in a memory 119, for example.

An operation of the central control device 113 can take place via a terminal with an input unit 111 (e.g., keyboard, mouse, etc.) and an output unit 109 (e.g., display, speaker, etc.), via which the entire MR system 160 can thus also be operated by an operator. The input unit 111 and output unit 109 may collectively be formed by a computer or other computing device, for example. MR images can also be displayed at the output unit 109, and measurements can be planned and started, and in particular suitable control protocols with suitable measurements can be selected as explained above and be modified if applicable, by means of the input unit 111, possibly in combination with the output unit 109. In an exemplary embodiment, the controller 113 may include processing circuitry that is configured to perform one or more operations and/or functions of the controller 113. Additionally, or alternatively, one or more components of the controller 113 may include processing circuitry that is configured to perform one or more operations and/or functions of the respective component(s).

The MR system 160 according to the disclosure, and in particular the control device 113, can moreover still have a multitude of additional components that are not depicted here in detail but are typically present in such apparatuses, for example a network interface in order to connect the overall system with a network and be able to exchange raw data RD and/or image data BD or parameter maps, but also further data, for example patient-relevant data or control protocols.

How suitable raw data RD can be acquired via a radiation of RF pulses and the generation of gradient fields, and how MR images BD can be reconstructed therefrom, is generally known to the person skilled in the art and is not explained in detail here.

From the previous specification, it is clear that the disclosure provides effective possibilities in order to improve, with regard to the required duration, a method for driving a magnetic resonance imaging system to generate magnetic resonance image data.

It is thereby to be noted that the features of all exemplary embodiments or developments disclosed in Figures can be used in any combination.

Finally, it is to be noted again that the methods and structural systems described in detail in the preceding are exemplary embodiments, and that the basic principle can also be varied in wide ranges by the person skilled in the art without leaving the area of the disclosure insofar as it is provided by the claims. For the sake of completeness, it is also noted in this regard that the use of the indefinite article "a" or "an" does not preclude that the appertaining features can also be present multiple times. Likewise, the term "unit" does not preclude that this also consists of a plurality of components that may possibly also be spatially distributed. Independently of grammatical gender of a specific term, persons with male, female, or other gender identity are encompassed.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

The various components described herein (e.g., components of the controller 113) may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for controlling a magnetic resonance imaging (MRI) system to generate magnetic resonance image data of an examination subject, the method comprising:
performing an accelerated echoplanar imaging with an undersampling according to a pulse sequence diagram to acquire k-space data, wherein the pulse sequence diagram has a plurality of repetitions which respectively comprise:
a first sampling diagram configured for an acquisition of k-space data for Nyquist ghost correction, or to generate magnetic field maps,
a subsequent second sampling diagram configured for an accelerated echoplanar acquisition, and
an excitation diagram that is common to both the acquisition of the k-space data and the accelerated echoplanar acquisition, wherein the first sampling diagram of a real subset of the plurality of repetitions is modified such that, based on the k-space data acquired according to the modified first sampling diagrams:
k-space data missing due the undersampling is supplemented, and/or
artifacts due to the undersampling in image space are corrected.

2. A controller for a magnetic resonance imaging (MRI) system, the controller comprising:
one or more processors; and
memory storing instructions that, when executed by the one or more processors, configure the controller to:
control the MRI system to perform an accelerated echoplanar imaging with an undersampling according to a pulse sequence diagram to acquire k-space data, wherein the pulse sequence diagram has a plurality of repetitions which respectively comprise:
a first sampling diagram configured for an acquisition of k-space data for Nyquist ghost correction, or to generate magnetic field maps,
a subsequent second sampling diagram configured for an accelerated echoplanar acquisition, and
an excitation diagram that is common to both the acquisition of the k-space data and the accelerated echoplanar acquisition, wherein the first sampling diagram of a real subset of the plurality of repetitions is modified such that, based on the k-space data acquired according to the modified first sampling diagrams:
k-space data missing due the undersampling is supplemented, and/or
artifacts due to the undersampling in image space are corrected.

3. A non-transitory computer-readable medium storing instructions, that when executed by one or more processors, cause the one or more processors to perform a method for driving a magnetic resonance imaging (MRI) system to generate magnetic resonance image data of an examination subject, the method comprising:
performing an accelerated echoplanar imaging with an undersampling according to a pulse sequence diagram to acquire k-space data, wherein the pulse sequence diagram has a plurality of repetitions which respectively comprise:
a first sampling diagram configured for an acquisition of k-space data for Nyquist ghost correction, or to generate magnetic field maps,
a subsequent second sampling diagram configured for an accelerated echoplanar acquisition, and
an excitation diagram that is common to both the acquisition of the k-space data and the accelerated echoplanar acquisition, wherein the first sampling diagram of a real subset of the plurality of repetitions is modified such that, based on the k-space data acquired according to the modified first sampling diagrams:
k-space data missing due the undersampling is supplemented, and/or
artifacts due to the undersampling in image space are corrected.

4. The method according to claim 1, wherein, in the modification of the first sampling diagram, a duration of a repetition, of the real subset of the plurality of repetitions, affected by the modification is maintained without being changed.

5. The method according to claim 1, wherein the modified first sampling diagram and a number of the plurality of repetitions comprised by the real subset are chosen such that a complete sampling of a partial k-space region is performed, the complete sampling of the partial k-space region being required for a complete supplementation of the missing k-space data.

6. The method according to claim 1, wherein the modified first sampling diagram comprises a sampling of k-space lines in a readout direction ($k_x$) with different phase encoding ($k_y$).

7. The method according to claim 1, wherein the modified first sampling diagram comprises a sampling of k-space lines in a readout direction ($k_x$) with at least partially different slice encoding ($k_z$).

8. The method according to claim 1, wherein a sampling diagram of a same type is used for the modified first sampling diagram and the second sampling diagram.

9. The method according to claim 1, wherein an updating of the k-space data acquired with the modified first sampling diagram is performed at different points in time of the accelerated echoplanar imaging.

10. The method according to claim 1, wherein the modified first sampling diagram comprises:
at least four successive phase encoding gradients; and
at least three successive readout gradients with changing polarity, which alternate in time with the phase encoding gradients.

11. The method according to claim 1, wherein the accelerated echoplanar imaging comprises:
GeneRalized Autocalibrating Partially Parallel Acquisitions (GRAPPA),
Simultaneous Multi-Slice (SMS) or Slice GRAPPA,
SENSitivity Encoding (SENSE),
a combination of GRAPPA and SMS, or
an imaging technique with dual polarity.

12. The controller according to claim 2, wherein the controller is comprised within the MRI system.

13. The method according to claim 10, wherein slice selection gradients are switched synchronously with a second through fourth phase encoding gradients.

14. The method according to claim 10, wherein amplitudes of the phase encoding gradients of the modified first sampling diagram are selected based on an undersampling factor of the second sampling diagram.

* * * * *